United States Patent
Kameyama et al.

(10) Patent No.: US 7,924,898 B2
(45) Date of Patent: Apr. 12, 2011

(54) NITRIDE BASED SEMICONDUCTOR LASER DEVICE WITH OXYNITRIDE PROTECTIVE COATINGS ON FACETS

(75) Inventors: Shingo Kameyama, Osaka (JP); Yasuhiko Nomura, Osaka (JP); Ryoji Hiroyama, Kyoto (JP); Masayuki Hata, Osaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 199 days.

(21) Appl. No.: 12/236,627

(22) Filed: Sep. 24, 2008

(65) Prior Publication Data
US 2009/0086778 A1    Apr. 2, 2009

(30) Foreign Application Priority Data

Sep. 28, 2007  (JP) ................................. 2007-253413
Sep. 18, 2008  (JP) ................................. 2008-240084

(51) Int. Cl.
*H01S 5/028* (2006.01)
(52) U.S. Cl. .................................................... 372/49.01
(58) Field of Classification Search ................ 372/49.01
See application file for complete search history.

(56) References Cited

U.S. PATENT DOCUMENTS

| | | | |
|---|---|---|---|
| 5,923,690 A | 7/1999 | Kume et al. | |
| 6,849,875 B2 | 2/2005 | Ishida | |
| 7,750,363 B2 | 7/2010 | Kamikawa et al. | |
| 2007/0087460 A1 | 4/2007 | Sakong et al. | |
| 2007/0177646 A1* | 8/2007 | Sogabe et al. | 372/49.01 |
| 2008/0181275 A1 | 7/2008 | Matsuyama et al. | |
| 2008/0298411 A1 | 12/2008 | Hata | |

FOREIGN PATENT DOCUMENTS

JP    08-213692 A    8/1996

OTHER PUBLICATIONS

"Continuous-Wave Operation of m-Plane InGaN Multiple Quantum Well Laser Diodes", K. Okamoto et al. / Japanese Journal of Applied Physics vol. 46, No. 9, 2007, pp. L187-L189.
An office action issued to a relevant U.S. Appl. No. 12/130,551 on Apr. 21, 2010.
An office action issued to a relevant U.S. Appl. No. 12/128,400 on Jul. 12, 2010.
An office action issued to a relevant U.S. Appl. No. 12/130,551 on Sep. 23, 2010.

* cited by examiner

*Primary Examiner* — Minsun Harvey
*Assistant Examiner* — Marcia A. Golub-Miller
(74) *Attorney, Agent, or Firm* — Marvin A. Motsenbocker; Mots Law, PLLC

(57) ABSTRACT

One facet and the other facet of a nitride based semiconductor laser device are respectively composed of a cleavage plane of (0001) and a cleavage plane of (000$\bar{1}$). Thus, the one facet and the other facet are respectively a Ga polar plane and an N polar plane. A portion of the one facet and a portion of the other facet, which are positioned in an optical waveguide, constitute a pair of cavity facets. A first protective film including oxygen as a constituent element is formed on the one facet. A second protective film including nitrogen as a constituent element is formed on the other facet.

8 Claims, 11 Drawing Sheets

NITRIDE BASED SEMICONDUCTOR LASER DEVICE WITH OXYNITRIDE PROTECTIVE COATINGS ON FACETS

BACKGROUND OF THE INVENTION

1. Field of the Invention

The present invention relates to a nitride based semiconductor laser device having a nitride based semiconductor layer.

2. Description of the Background Art

In recent years, nitride-based semiconductor laser devices have been utilized as light sources for next-generation large-capacity disks and have been actively developed.

In such nitride-based semiconductor laser devices, the plane directions of main surfaces of active layers are taken as substantial (H, K, —H—K, O) planes such as (11$\bar{2}$0) planes or (1$\bar{1}$00) planes, so that piezoelectric fields generated in the active layers can be reduced. As a result, it is known that the luminous efficiency of laser light can be improved. Here, H and K, described above, are any integers, and at least one of H and K is an integer other than zero.

Furthermore, it has been known that the gains of the nitride based semiconductor laser devices can be improved by setting the (0001) planes and the (000$\bar{1}$) planes to pairs of cavity facets (see, for example, JP 8-213692A and Japanese Journal of Applied Physics Vol. 46, No. 9, 2007, pp. L187~L189).

In the above-mentioned nitride based semiconductor laser devices, however, protective films formed on the cavity facets are easily stripped.

SUMMARY OF THE INVENTION

According to an aspect of the present invention, a nitride based semiconductor laser device includes a nitride based semiconductor layer having an optical waveguide extending in a substantial [0001] direction and having one facet composed of a substantial (0001) plane and the other facet composed of a substantial (000$\bar{1}$) plane as a pair of cavity facets, a first protective film provided on the one facet and including oxygen as a constituent element, and a second protective film provided on the other facet and including nitrogen as a constituent element.

The intensity of the laser light emitted from the one facet may be higher than the intensity of the laser light emitted from the other facet.

Each of a portion of the one facet and a portion of the other facet in the optical waveguide may have unevenness, and the depth of a first recess in the one facet may be smaller than the depth of a second recess in the other facet.

The intensity of the laser light emitted from the other facet may be higher than the intensity of the laser light emitted from the one facet.

The first protective film may include no nitrogen as a constituent element. Alternatively, the first protective film may further include nitrogen as a constituent element, and the oxygen composition ratio may be higher than the nitrogen composition ratio in the first protective film.

The second protective film may include no oxygen as a constituent element. Alternatively, the second protective film may further include oxygen as a constituent element, and the nitrogen composition ratio may be higher than the oxygen composition ratio in the second protective film.

The nitride based semiconductor laser device may further include a dielectric multilayer film formed on the one facet and including the first protective film, in which the dielectric multilayer film may include a first oxide film and a second oxide film that are laminated in this order from the one facet, and the first protective film may be the first oxide film.

The nitride based semiconductor laser device may further include a dielectric multilayer film formed on the one facet and including the first protective film, in which the dielectric multilayer film may include an oxynitride film and an oxide film that are laminated in this order from the one facet, the oxygen composition ratio may be higher than the nitrogen composition ratio in the oxynitride film, and the first protective film may be the oxynitride film.

The nitride based semiconductor laser device may further include a dielectric multilayer film formed on the one facet and including the first protective film, in which the dielectric multilayer film may include a first oxide film, an oxynitride film, and a second oxide film that are laminated in this order from the one facet, the nitrogen composition ratio may be higher than the oxygen composition ratio in the oxynitride film, and the first protective film may be the first oxide film.

The nitride based semiconductor laser device may further include a dielectric multilayer film formed on the one facet and including the first protective film, in which the dielectric multilayer film may include a first oxynitride film, a second oxynitride film, and an oxide film that are laminated in this order from the one facet, the oxygen composition ratio may be higher than the nitrogen composition ratio in the first oxynitride film, the nitrogen composition ratio may be higher than the oxygen composition ratio in the second oxynitride film, and the first protective film may be the first oxynitride film.

The nitride based semiconductor laser device may include a dielectric multilayer film formed on the other facet and including the second protective film, in which the dielectric multilayer film may include a nitride film and an oxide film that are laminated in this order from the other facet, and the second protective film may be the nitride film.

The nitride based semiconductor laser device may further include a dielectric multilayer film formed on the other facet and including the second protective film, in which the dielectric multilayer film may include a first nitride film, an oxide film, and a second nitride film that are laminated in this order from the other facet, and the second protective film may be the first nitride film.

The nitride based semiconductor laser device may further include a dielectric multilayer film formed on the other facet and including the second protective film, in which the dielectric multilayer film may include an oxynitride film and an oxide film that are laminated in this order from the other facet, the nitrogen composition ratio may be higher than the oxygen composition ratio in the oxynitride film, and the second protective film may be the oxynitride film.

The nitride based semiconductor laser device may further include a dielectric multilayer film formed on the other facet and including the second protective film, in which the dielectric multilayer film may include a nitride film, an oxynitride film, and an oxide film that are laminated in this order from the other facet, the nitrogen composition ratio may be higher than the oxygen composition ratio in the oxynitride film, and the second protective film may be the nitride film.

The nitride based semiconductor laser device may further include a dielectric multilayer film formed on the other facet and including the second protective film, in which the dielectric multilayer film may include a first oxynitride film, a second oxynitride film, and an oxide film that are laminated in this order from the other facet, the nitrogen composition ratio may be higher than the oxygen composition ratio in the first oxynitride film, the oxygen composition ratio may be higher than the nitrogen composition ratio in the second oxynitride film, and the second protective film may be the first oxynitride film.

The first protective film may include at least one of $AlO_xN_y$, $SiO_xN_y$ and $TaO_xN_y$, where X>Y.

The second protective film may include at least one of AlN and $Si_3N_4$.

The second protective film may include at least one of $AlO_xN_y$, $SiO_xN_y$ and $TaO_xN_y$, where X<Y.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
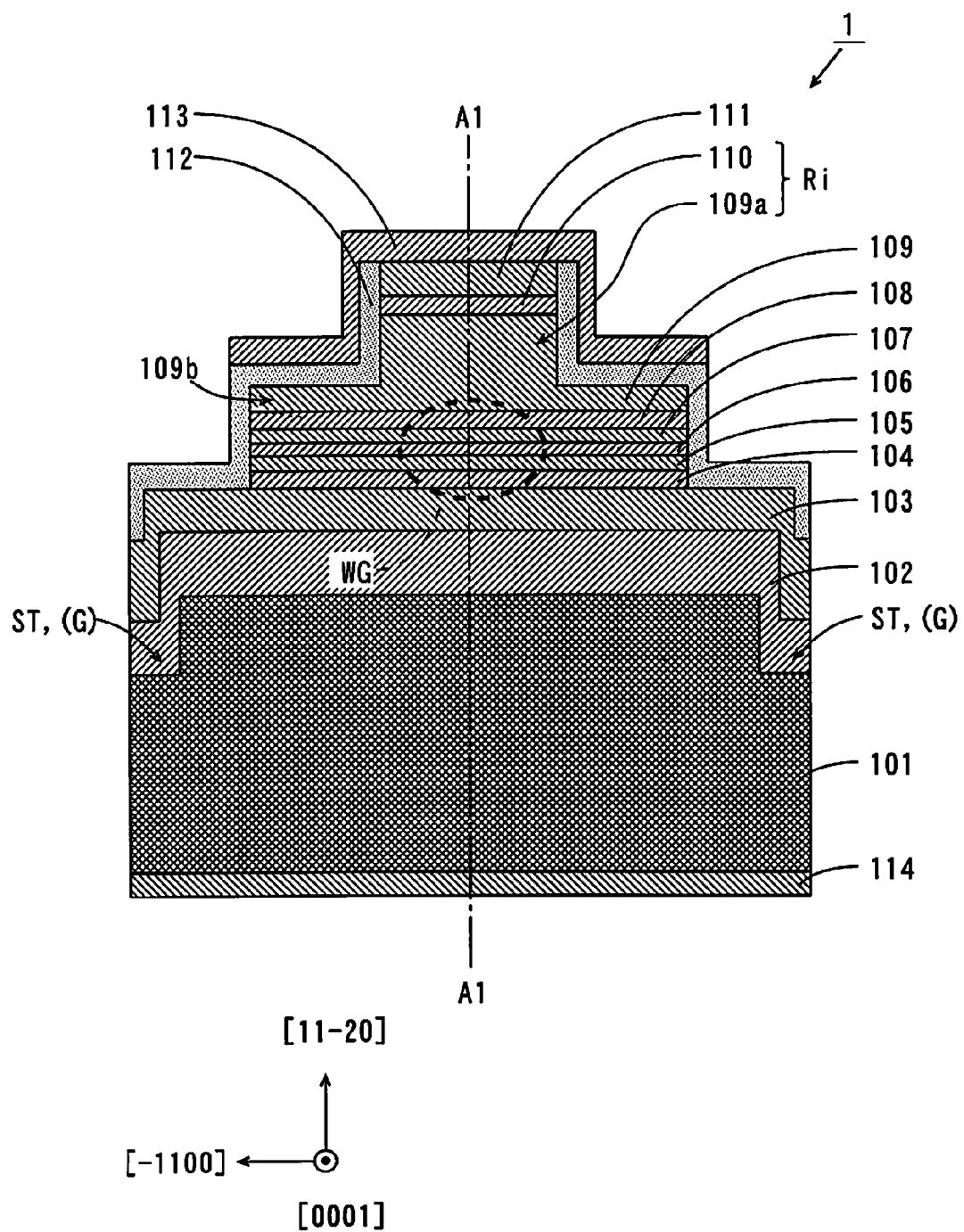
FIG. 1 is a vertical sectional view of a nitride based semiconductor laser device according to a first embodiment.
Figure 2:
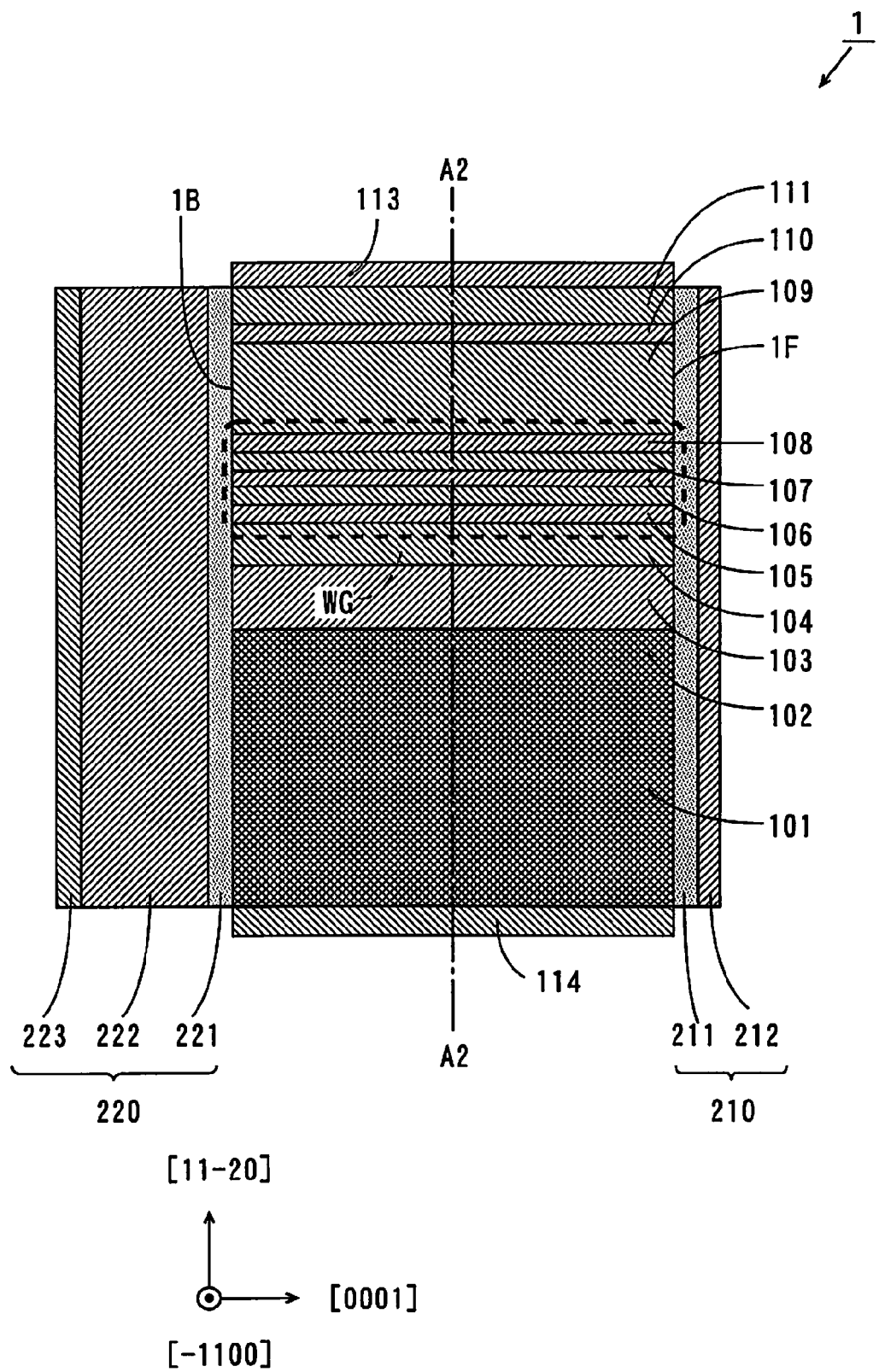
FIG. 2 is a vertical sectional view of a nitride based semiconductor laser device according to a first embodiment.

1. First Embodiment (1) Configuration of Nitride Based Semiconductor Laser Device FIGS. 1 and 2 are vertical sectional views of a nitride based semiconductor laser device according to a first embodiment. A line A1-A1 shown in FIG. 1 represents a position in longitudinal section, and a line A2-A2 shown in FIG. 2 represents a position in longitudinal section.

As shown in FIGS. 1 and 2, a nitride based semiconductor laser device 1 according to the present embodiment includes an n-type GaN substrate 101 having a thickness of approximately 100 μm in which Si (silicon) has been doped. The carrier concentration of the substrate 101 is approximately $5\times10^{18}$ cm$^{-3}$.

The substrate 101 is an off substrate having a crystal growth plane inclined at approximately 0.3 degrees in a [000$\bar{1}$] direction from a (11$\bar{2}$0) plane. As shown in FIG. 1, a pair of steps ST extending in a [0001] direction is formed on an upper surface of the substrate 101. The pair of steps ST is positioned on both sides of the substrate 101. The depth of each of the steps ST is approximately 0.5 μm, and the width thereof is approximately 20 μm.

An n-type layer 102 having a thickness of approximately 100 nm in which Si has been doped is formed on the upper surface of the substrate 101. Then-type layer 102 is composed of n-type GaN, and the amount of doping of Si into the n-type layer 102 is approximately $5\times10^{18}$ cm$^{-3}$.

An n-type cladding layer 103 composed of n-type $Al_{0.07}Ga_{0.93}N$ having a thickness of approximately 400 nm in which Si has been doped is formed on the n-type layer 102. The amount of doping of Si into the n-type cladding layer 103 is approximately $5\times10^{18}$ cm$^{-3}$, and the carrier concentration of the n-type cladding layer 103 is approximately $5\times10^{18}$ cm$^{-3}$.

An n-type carrier blocking layer 104 composed of n-type $Al_{0.16}Ga_{0.84}N$ having a thickness of approximately 5 nm in which Si has been doped is formed on the n-type cladding layer 103. The amount of doping of Si into the n-type carrier blocking layer 104 is approximately $5\times10^{18}$ cm$^{-3}$, and the carrier concentration of the n-type carrier blocking layer 104 is approximately $5\times10^{18}$ cm$^{-3}$.

An n-type optical guide layer 105 composed of n-type GaN having a thickness of approximately 100 nm in which Si has been doped is formed on the n-type carrier blocking layer 104. The amount of doping of Si into the n-type optical guide layer 105 is approximately $5\times10^{18}$ cm$^{-3}$, and the carrier concentration of the n-type optical guide layer 105 is approximately $5\times10^{18}$ cm$^{-3}$.

An active layer 106 is formed on the n-type optical guide layer 105. The active layer 106 has an MQW (Multi-Quantum Well) structure in which four barrier layers 106a (see FIG. 3, described later) composed of undoped $In_{0.02}Ga_{0.98}N$ having a thickness of approximately 20 nm and three well layers 106b (see FIG. 3, described later) composed of undoped $In_{0.6}Ga_{0.4}N$ having a thickness of approximately 3 nm are alternately laminated.

A P-type optical guide layer 107 composed of p-type GaN having a thickness of approximately 100 nm in which Mg (magnesium) has been doped is formed on the active layer 106. The amount of doping of Mg into the p-type optical guide layer 107 is approximately $4\times10^{19}$ cm$^{-3}$, and the carrier concentration of the p-type optical guide layer 107 is approximately $5\times10^{17}$ cm$^{-3}$.

An n-type cap layer 108 composed of p-type $Al_{0.16}Ga_{0.84}N$ having a thickness of approximately 20 nm in which Mg has been doped is formed on the p-type optical guide layer 107. The amount of doping of Mg into the p-type cap layer 108 is approximately $4\times10^{19}$ cm$^{-3}$, and the carrier concentration of the p-type cap layer 108 is approximately $5\times10^{17}$ cm$^{-3}$.

A p-type cladding layer 109 composed of p-type $Al_{0.07}Ga_{0.93}N$ in which Mg has been doped is formed on the p-type cap layer 108. The amount of doping of Mg into the p-type cladding layer 109 is approximately $4\times10^{19}$ cm$^{-3}$, and the carrier concentration of the p-type cap layer 108 is approximately $5\times10^{17}$ cm$^{-3}$.

Here, the p-type cladding layer 109 includes a flat portion 109b formed on the p-type cap layer 108 and a projection 109a extending in the [0001] direction on the center of the flat portion 109b.

The thickness of the flat portion 109b in the p-type cladding layer 109 is approximately 80 nm, and the height from an upper surface of the flat portion 109b to an upper surface of the projection 109a is approximately 320 nm. Furthermore, the width of the projection 109a is approximately 1.75 μm.

A p-type contact layer 110 composed of p-type $In_{0.02}Ga_{0.98}N$ having a thickness of approximately 10 nm in which Mg has been doped is formed on the projection 109a in the p-type cladding layer 109. The amount of doping of Mg into the p-type contact layer 110 is approximately $4\times10^{19}$ cm$^{-3}$, and the carrier concentration of the p-type contact layer 110 is approximately $5\times10^{17}$ cm$^{-3}$.

The projection 109a in the p-type cladding layer 109 and the p-type contact layer 110 constitute a ridge Ri. Thus, an optical waveguide WG along the [0001] direction is formed in a portion below the ridge Ri and including the active layer 106.

An ohmic electrode 111 is formed on the p-type contact layer 110. The ohmic electrode 111 has a structure in which Pt (platinum), Pd (palladium), and Au (gold) are laminated in this order. The thicknesses of Pt, Pd, and Au are 5 nm, 100 nm, and 150 nm, respectively.

A current narrowing layer 112 composed of an insulating film having a thickness of approximately 250 nm covers the upper surface of the flat portion 109b, an upper surface of the n-type cladding layer 103, and side surfaces of the above-mentioned layers 103 to 111. In this example, an SiO$_2$ (silicon oxide) film is used as an insulating film.

A pad electrode 113 is formed in respective predetermined regions of an upper surface of the ohmic electrode 111 and a side surface and an upper surface of the current narrowing layer 112. The pad electrode 113 has a structure in which Ti (titanium), Pd, and Au are laminated in this order. The thicknesses of Ti, Pd, and Au are approximately 100 nm, approximately 100 nm, and approximately 3 μm, respectively.

Furthermore, an n-side electrode 114 is formed on a back surface of the substrate 101. The n-side electrode 114 has a structure in which Al (aluminum), Pt, and Au are laminated in this order. The thicknesses of Al, Pt, and Au are respectively 10 nm, 20 nm, and 300 nm.

The n-type cladding layer 103, the n-type carrier blocking layer 104, the n-type optical guide layer 105, the active layer 106, the p-type optical guide layer 107, the p-type cap layer 108, the p-type cladding layer 109, and the p-type contact layer 110 constitute a nitride based semiconductor layer.

Here, out of paired cavity facets of the nitride based semiconductor laser device 1, the cavity facet having the lower reflective index and the cavity facet having the higher reflective index are respectively referred to as a light emission facet and a rear facet.

As shown in FIG. 2, a light emission facet 1F and a rear facet 1B of the nitride based semiconductor laser device 1 are respectively composed of a cleavage plane of (0001) and a cleavage plane of (000$\bar{1}$). Thus, the light emission facet 1F and the rear facet 1B are respectively a Ga (gallium) polar plane and an N (nitrogen) polar plane. A portion of the light emission facet 1F positioned in the optical waveguide WG and a portion of the rear facet 1B positioned in the optical waveguide WG constitute a pair of cavity facets.

A first dielectric multilayer film 210 is formed on the light emission facet 1F of the nitride based semiconductor laser device 1. The first dielectric multilayer film 210 has a structure in which an Al$_2$O$_3$ film 211 and an SiO$_2$ film 212 are laminated in this order. Thus, the Al$_2$O$_3$ film 211 serving as an oxide film functions as a protective film of the light emission facet 1F.

The thicknesses of the Al$_2$O$_3$ film 211 and the SiO$_2$ film 212 are approximately 120 nm and approximately 42 nm, respectively. The reflective index of the first dielectric multilayer film 210 is approximately 8%.

On the other hand, a second dielectric multilayer film 220 is formed on the rear facet 1B of the nitride based semiconductor laser device 1. The second dielectric multilayer film 220 has a structure in which an AlN film 221, a reflective film 222, and an AlN film 223 are laminated in this order. Thus, the AlN film 221 serving as a nitride film functions as a protective film of the rear facet 1B.

The respective thicknesses of the AlN films 221 and 223 are 10 nm. The reflective film 222 has a ten-layer structure in which five SiO$_2$ films having a thickness of approximately 70 nm and five TiO$_2$ films having a thickness of approximately 45 nm are alternately laminated. The SiO$_2$ film is used as a low refractive index film, and the TiO$_2$ film is used as a high refractive index film. The reflective index of the second dielectric multilayer film 220 is approximately 95%.

A voltage is applied between the pad electrode 113 and the n-side electrode 114 in the nitride based semiconductor laser device 1, so that laser light is respectively emitted from the light emission facet 1F and the rear facet 1B.

In the present embodiment, the first dielectric multilayer film 210 having a reflective index of approximately 8% is provided on the light emission facet 1F, and the second dielectric multilayer film 220 having a reflective index of approximately 95% is provided on the rear facet 1B, as described above. Thus, the intensity of the laser light emitted from the light emission facet 1F is significantly higher than the intensity of the laser light emitted from the rear facet 1B. That is, the light emission facet 1F is a principal emission facet of the laser light.

(2) Details of Light Emission Facet 1F and Rear Facet 1B

Figure 3:
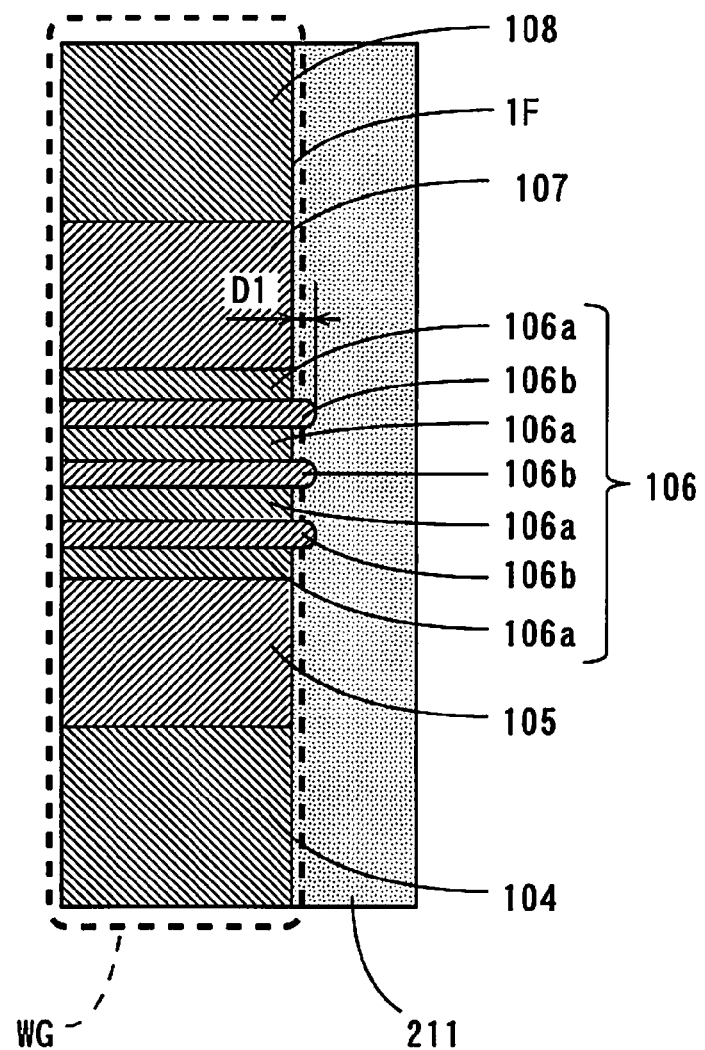
FIG. 3 is a partially enlarged sectional view of the nitride based semiconductor laser device shown in FIG. 2.
Figure 3:
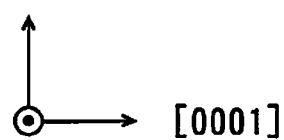
Figure 4:
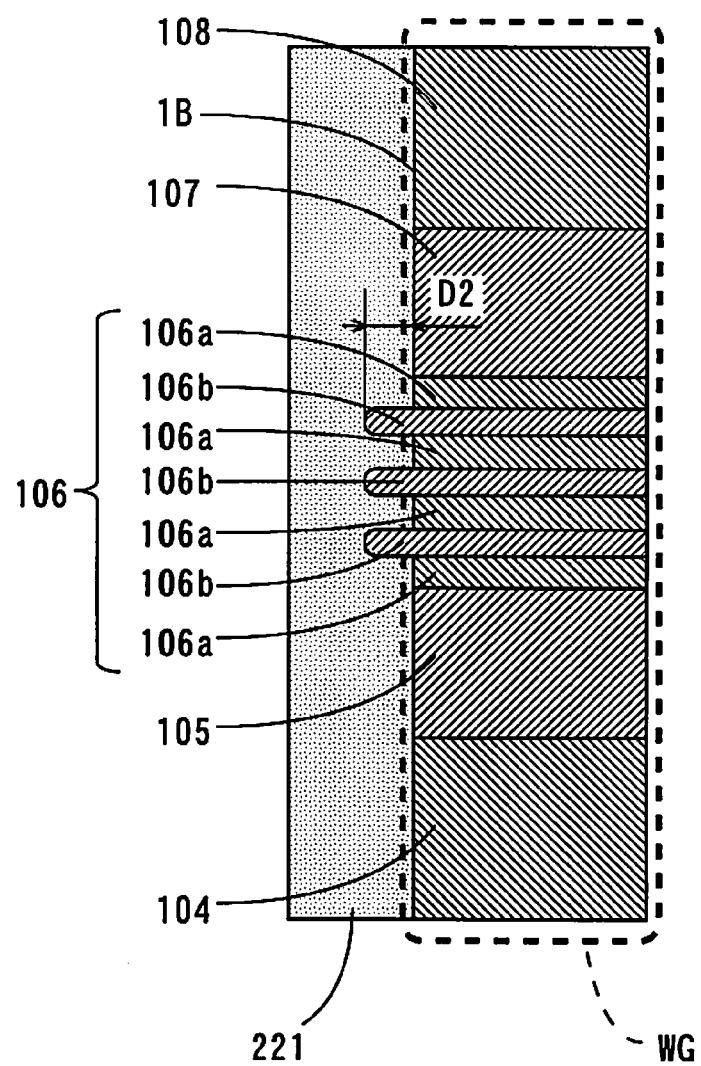
FIG. 4 is a partially enlarged sectional view of the nitride based semiconductor laser device shown in FIG. 2.

FIGS. 3 and 4 are partially enlarged sectional views of the nitride based semiconductor laser device 1 shown in FIG. 2. FIG. 3 is an enlarged sectional view of the light emission facet 1F and its vicinity in the optical waveguide WG, and FIG. 4 is an enlarged sectional view of the rear facet 1B and its vicinity in the optical waveguide WG.

As shown in FIGS. 3 and 4, the active layer 106 has a structure in which the four barrier layers 106a and the three well layers 106b are alternately laminated. In the light emission facet 1F and the rear facet 1B, the well layers 106b in the active layer 106 project outward farther than the other layers in the nitride based semiconductor laser. Therefore, a portion of the active layer 106 in each of the light emission facet 1F and the rear facet 1B has unevenness formed by recesses and projections formed therein.

The depth D1 (FIG. 3) of the recesses of the active layer 106 in the light emission facet 1F of the nitride based semiconductor laser device 1 is approximately 1 nm, while the depth D2 (FIG. 4) of the recesses of the active layer 106 in the rear facet 1B thereof is approximately 6 nm. Note that the thinner one of the high refractive index film (TiO$_2$ film) and the low refractive index film (SiO$_2$ film), i.e., the TiO$_2$ film in this example, in the reflective film 222 is adjusted to a thickness larger than the depth D2 of the recesses of the active layer 106 in the rear facet 1B. In this case, the second dielectric multilayer film 220 can be easily formed so as to reliably cover the recesses and projections of the active layer 106 in the rear facet 1B. This makes it possible to ensure a high reflective index of the second dielectric multilayer film 220.

The reason why the active layer 106 has the recesses and projections formed therein is as follows. When the nitride based semiconductor laser device 1 is manufactured, the light emission facet 1F and the rear facet 1B are cleaned, as described later. In the cleaning process, the light emission facet 1F and the rear facet 1B are irradiated with ECR (Electron Cyclotron Resonance) plasma. Thus, the light emission facet 1F and the rear facet 1B are etched.

Here, the composition of the well layers 106a in the active layer 106 differs from the respective compositions of the other layers, in the nitride based semiconductor layer, such as the barrier layers 106a, the n-type optical guide layer 105, and the p-type optical guide layer 107. Therefore, a difference occurs between the etching amount of the well layer 106b in the active layer 106 and the etching amount of the other layer in the nitride based semiconductor layer. Therefore, the recesses and projections are formed in the portion of the active layer 106 in each of the light emission facet 1F and the rear facet 1B.

The higher the In composition ratio in the well layer 106b composed of undoped $In_xGa_{1-x}N$ is, the more significant the recesses and projections become. This is caused by the difference between the composition of the well layer 106b and the composition of the other layer being greater when the In composition ratio is higher than the Ga composition ratio in the well layer 106 ($0.5 < x \leq 1$). In the present embodiment, the In composition ratio x in the well layer 106b is 0.6.

Particularly, the $(000\bar{1})$ plane of the nitride based semiconductor layer is chemically stabler than the (0001) plane thereof. Therefore, the difference in the etching amount between the well layer 106b and the other layer in the $(000\bar{1})$ plane is greater than the difference in the etching amount between the well layer 106b and the other layer in the (0001) plane. Thus, the depth D2 of the recesses in the rear facet 1B is larger than the depth D1 of the recesses in the light emission facet 1F.

The larger the depth of recesses in a cavity facet having a concavo-convex shape is, the more greatly laser light is scattered due to the concavo-convex shape. In the present embodiment, the light emission facet 1F is composed of the (0001) plane having few recesses and projections. This can inhibit the laser light from being scattered on the light emission facet 1F. As a result, a preferable far field pattern having few ripples can be obtained at the time of lasing.

(3) Method for Manufacturing Nitride Based Semiconductor Laser Device 1

A method for manufacturing the nitride based semiconductor laser device 1 having the above-mentioned configuration will be described.

First, a substrate 101 having a plurality of grooves G (see FIG. 1) extending in a [0001] direction formed on its upper surface is first prepared. The depth of the groove G is approximately 0.5 μm, and the width thereof is approximately 40 μm. A distance between the adjacent two grooves G is approximately 400 μm. Note that the groove G is previously formed in order to make the device into chips in later processes. A part of the groove G constitutes the above-mentioned step ST.

An n-type layer 102 having a thickness of approximately 100 nm, an n-type cladding layer 103 having a thickness of approximately 400 nm, an n-type carrier blocking layer 104 having a thickness of approximately 5 nm, an n-type optical guide layer 105 having a thickness of approximately 100 nm, an active layer 106 having a thickness of approximately 90 nm, a p-type optical guide layer 107 having a thickness of approximately 100 nm, a p-type cap layer 108 having a thickness of approximately 20 nm, a p-type cladding layer 109 having a thickness of approximately 400 nm, and a p-type contact layer 110 having a thickness of approximately 10 nm are sequentially formed on an upper surface of the substrate 101 by metal organic vapor phase epitaxy (MOVPE), for example.

Note that the thickness of the active layer 106 represents the total thickness of four barrier layers 106a and three well layers 106b.

Thereafter, annealing for changing into a p type and formation of a ridge Ri shown in FIG. 1 are performed. An ohmic electrode 111, a current narrowing layer 112, and a pad electrode 113 are formed. Furthermore, an n-side electrode 114 is formed on a back surface of the substrate 101.

Then, a cavity facet (a light emission facet 1F and a rear facet 1B) is formed, and a first dielectric multilayer film 210 and a second dielectric multilayer film 220 are formed on the cavity facet, as described later.

Scribe flaws extending in a $[1\bar{1}00]$ direction are formed on the substrate 101 on which the layers 102 to 110, the ohmic electrode 111, the current narrowing layer 112, and the pad electrode 113 are formed. The scribe flaws are formed in a broken-line shape in a portion excluding the ridge Ri by laser scribing or mechanical scribing.

Then, the substrate 101 is cleaved such that the light emission facet 1F and the rear facet 1B are formed. Thus, the substrate 101 is separated into sticks.

Therefore, the separated substrate 101 is introduced into an ECR sputter film formation device.

The light emission facet 1F obtained by the cleavage is irradiated with plasma for five minutes. Note that the plasma is generated under conditions of a microwave power of 500 W in a $N_2$ gas atmosphere of approximately 0.02 Pa. Thus, the light emission facet 1F is cleaned while being slightly etched. In this case, no RF power (high-frequency power) is applied to a sputter target. Thereafter, the first dielectric multilayer film 210 (see FIG. 2) is formed on the light emission facet 1F by ECR sputtering.

Similarly, the rear facet 1B obtained by the cleavage is irradiated with plasma for five minutes. Thus, the rear facet 1B is cleaned while being slightly etched. In the case, no RF power is applied to a sputter target. Thereafter, the second dielectric multilayer film 220 (see FIG. 2) is formed on the rear facet 1B by ECR sputtering.

Thus cleaning the light emission facet 1F and the rear facet 1B by the ECR plasma inhibits the degradation of the cavity facet and the occurrence of optical breakdown of the cavity facet. This allows the laser characteristics of the nitride based semiconductor laser device 1 to be improved.

Thereafter, the stick-shaped substrate 101 is separated into chips at the center of the groove G formed on the substrate 101. Thus, the nitride based semiconductor laser device 1 shown in FIG. 1 is completed.

2. Second Embodiment

As to a nitride based semiconductor laser device according to a second embodiment, the difference from the nitride based semiconductor laser device 1 according to the first embodiment will be described.

Figure 5:
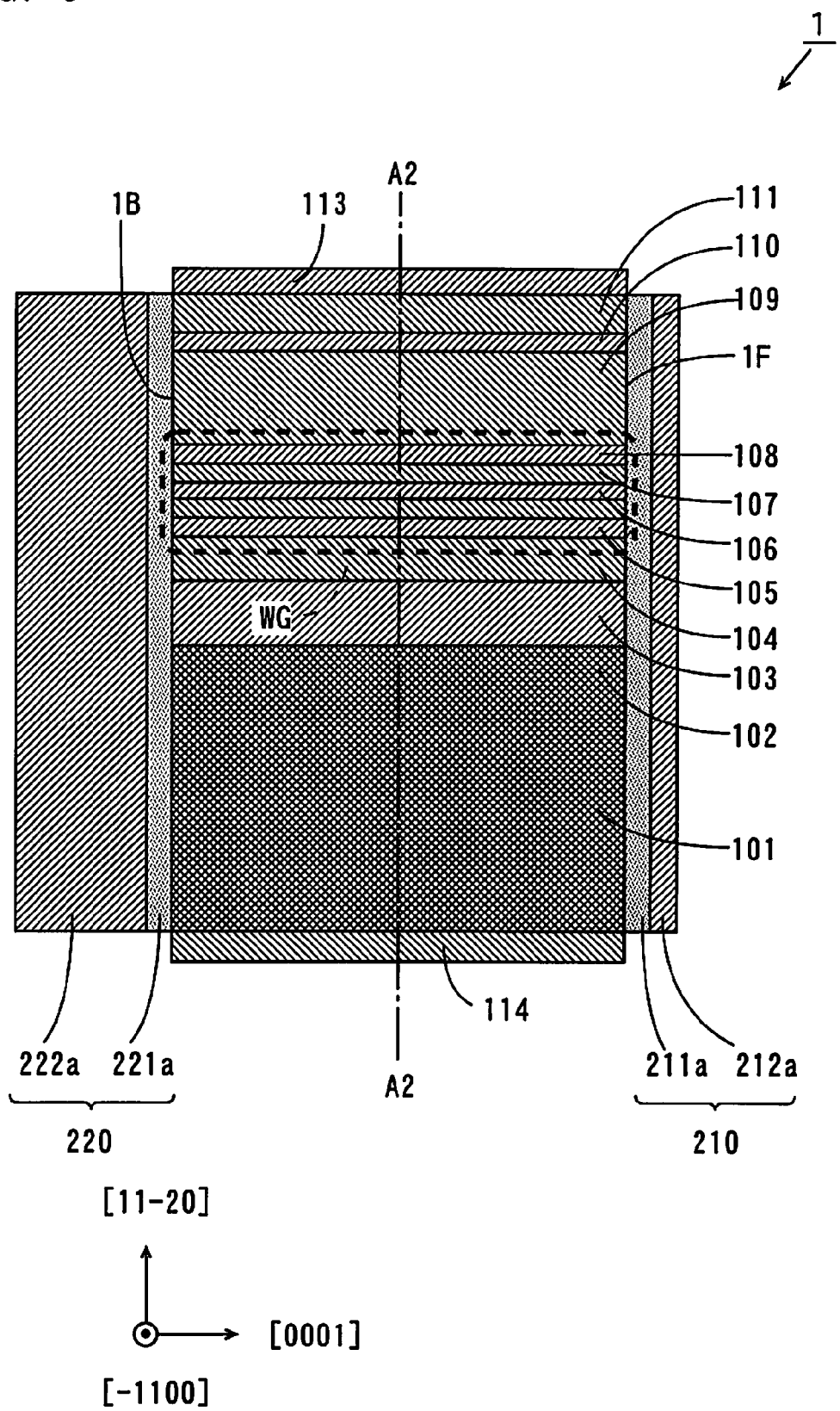
FIG. 5 is a vertical sectional view of a nitride based semiconductor laser device according to a second embodiment.

FIG. 5 is a vertical sectional view of the nitride based semiconductor laser device according to the second embodiment. In FIG. 5, a vertical section of the nitride based semiconductor laser device 1 along a [0001] direction is shown, similarly to the vertical section shown in FIG. 2 in the first embodiment. A vertical section taken along a line A2-A2 shown in FIG. 5 is the same as the vertical section of the nitride based semiconductor laser device 1 shown in FIG. 1.

A first dielectric multilayer film 210 is formed on a light emission facet 1F of the nitride based semiconductor laser device 1. The first dielectric multilayer film 210 has a structure in which an $AlO_xN_Y$ film (X>Y) 211a and an $Al_2O_3$ film 212a are laminated in this order. Here, the refractive index of the $AlO_XN_Y$ film 211a is approximately 1.7. The $Al_XN_Y$ film 211a serving as an oxynitride film in which the oxygen composition ratio is higher than the nitrogen composition ratio functions as a protective film of the light emission facet 1F.

The thicknesses of the $AlO_XN_Y$ film 211a and the $Al_2O_3$ film 212a are approximately 30 nm and approximately 57 nm, respectively. The reflective index of the first dielectric multilayer film 210 is approximately 8%.

On the other hand, a second dielectric multilayer film 220 is formed on a rear facet 1B of the nitride based semiconductor laser device 1. The second dielectric multilayer film 220 has a structure in which an $AlO_XN_Y$ film (X<Y) 221a and a reflective film 222a are laminated in this order. The refractive index of the $AlO_XN_Y$ film 221a is approximately 1.9. The $AlO_XN_Y$ film 221a serving as an oxynitride film in which the nitrogen composition ratio is higher than the oxygen composition ratio functions as a protective film of the rear facet 1B.

The thickness of the $AlO_XN_Y$ film 221a is approximately 30 nm. The reflective film 222a has a ten-layer structure in which five $SiO_2$ films having a thickness of approximately 70 nm and five $TiO_2$ films having a thickness of approximately 45 nm are alternately laminated. The $SiO_2$ film is used as a low refractive index film, and the $TiO_2$ film is used as a high refractive index film. The reflective index of the second dielectric multilayer film 220 is approximately 95%.

3. Third Embodiment

As to a nitride based semiconductor laser device according to a third embodiment, the difference from the nitride based semiconductor laser device 1 according to the first embodiment will be described.

Figure 6:
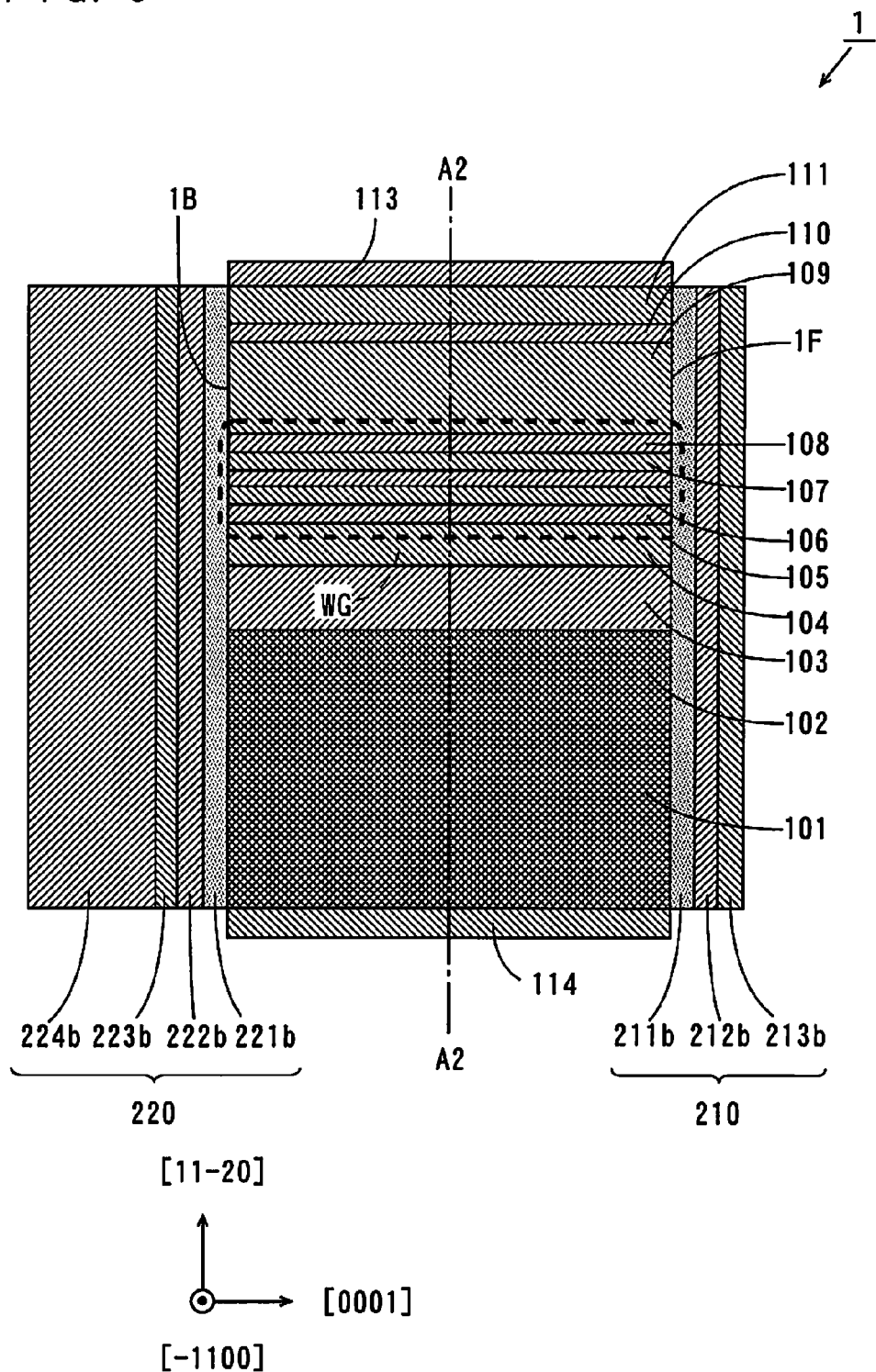
FIG. 6 is a vertical sectional view of a nitride based semiconductor laser device according to a third embodiment.

FIG. 6 is a vertical sectional view of the nitride based semiconductor laser device according to the third embodiment. In FIG. 6, a vertical section of the nitride based semiconductor laser device 1 along a [0001] direction is shown, similarly to the vertical section shown in FIG. 2 in the first embodiment. A vertical section taken along a line A2-A2 shown in FIG. 6 is the same as the vertical section of the nitride based semiconductor laser device 1 shown in FIG. 1.

A first dielectric multilayer film 210 is formed on a light emission facet 1F of the nitride based semiconductor laser device 1. The first dielectric multilayer film 210 has a structure in which an $Al_2O_3$ film 211b, an $AlO_XN_Y$ film (X<Y) 212b, and an $Al_2O_3$ film 213b are laminated in this order. The refractive index of the $AlO_XN_Y$ film 212b is approximately 1.9. The $Al_2O_3$ film 211b serving as an oxide film functions as a protective film of the light emission facet 1F.

The thicknesses of the $Al_2O_3$ film 211b, the $AlO_XN_Y$ film 212b, and the $Al_2O_3$ film 213a are approximately 10 nm, approximately 30 nm, and approximately 52 nm, respectively. The reflective index of the first dielectric multilayer film 210 is approximately 8%.

On the other hand, a second dielectric multilayer film 220 is formed on a rear facet 1B of the nitride based semiconductor laser device 1. The second dielectric multilayer film 220 has a structure in which an AlN film 221b, an $AlO_XN_Y$ film (X<Y) 222b, an $Al_2O_3$ film 223b, and a reflective film 224b are laminated in this order. The refractive index of the $AlO_XN_Y$ film 222b is approximately 1.9. The AlN film 221b serving as a nitride film functions as a protective film of the rear facet 1B.

The thicknesses of the AlN film 221b, the $AlO_XN_Y$ film 222b, and the $Al_2O_3$ film 223b are approximately 10 nm, approximately 30 nm, and approximately 60 nm, respectively. The reflective film 224b has a ten-layer structure in which five $SiO_2$ films having a thickness of approximately 70 nm and five $TiO_2$ films having a thickness of approximately 45 nm are alternately laminated. The $SiO_2$ film is used as a low refractive index film, and the $TiO_2$ film is used as a high refractive index film. The reflective index of the second dielectric multilayer film 220 is approximately 95%.

4. Fourth Embodiment

As to a nitride based semiconductor laser device according to a fourth embodiment, the difference from the nitride based semiconductor laser device 1 according to the first embodiment will be described.

Figure 7:
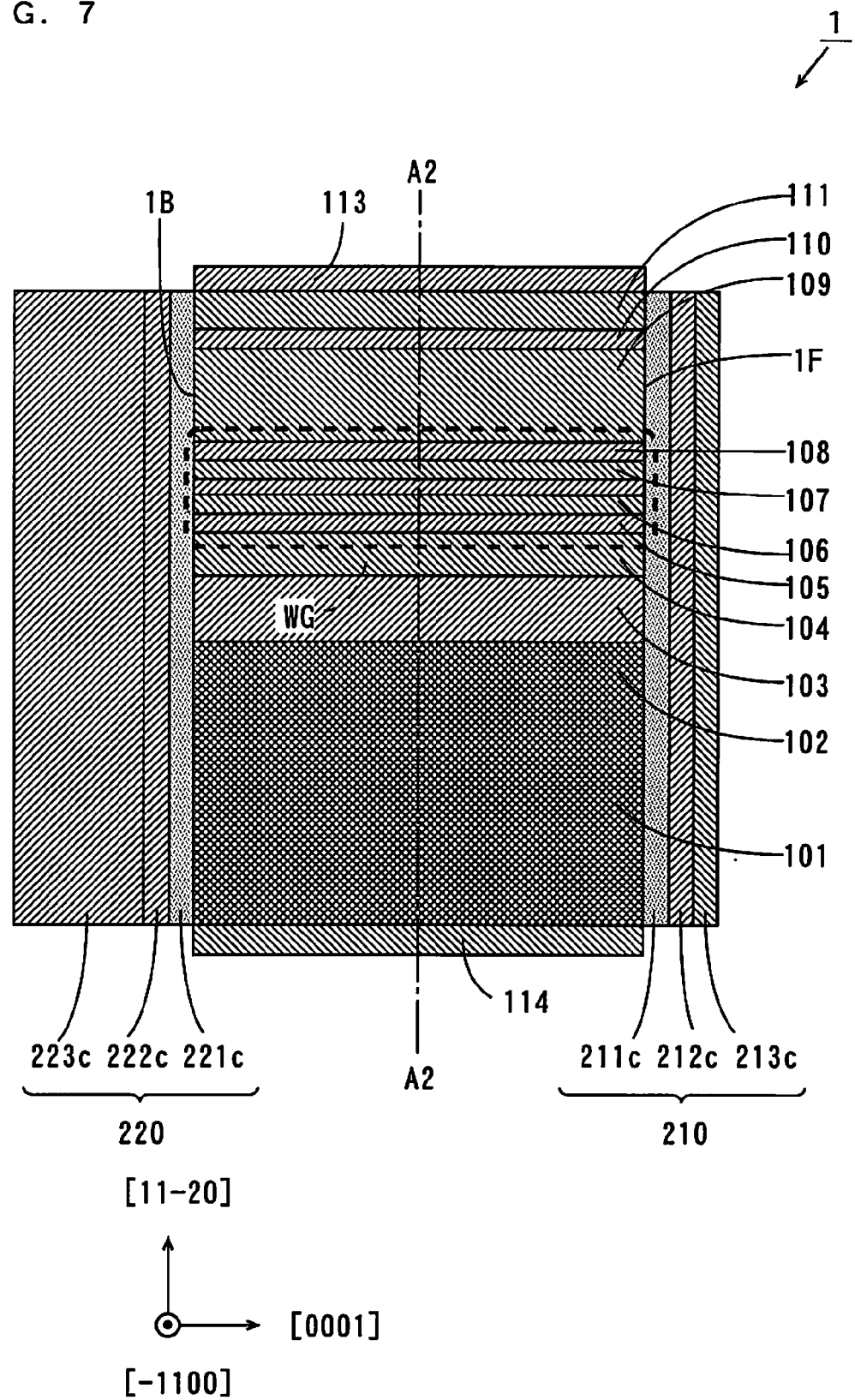
FIG. 7 is a vertical sectional view of a nitride based semiconductor laser device according to a fourth embodiment.

FIG. 7 is a vertical sectional view of the nitride based semiconductor laser device according to the fourth embodiment. In FIG. 7, a vertical section of the nitride based semiconductor laser device 1 along a [0001] direction is shown, similarly to the vertical section shown in FIG. 2 in the first embodiment. A vertical section taken along a line A2-A2 shown in FIG. 7 is the same as the vertical section of the nitride based semiconductor laser device 1 shown in FIG. 1.

A first dielectric multilayer film 210 is formed on a light emission facet 1F of the nitride based semiconductor laser device 1. The first dielectric multilayer film 210 has a structure in which an $AlO_XN_Y$ film (X>Y) 211c, an $AlO_XN_Y$ film (X<Y) 212c, and an $Al_2O_3$ film 213c are laminated in this order. The refractive indexes of the $AlO_XN_Y$ film 211c and the $Al_XN_Y$ film 212c are approximately 1.7 and approximately 1.9, respectively. The $AlO_XN_Y$ film 211c serving as an oxynitride film in which the oxygen composition ratio is higher than the nitrogen composition ratio functions as a protective film of the light emission facet 1F.

The thicknesses of the $AlO_XN_Y$ film 211c, the $AlO_XN_Y$ film 212c, and the $Al_2O_3$ film 213c are approximately 30 nm, approximately 30 nm, and approximately 15 nm, respectively. The reflective index of the first dielectric multilayer film 210 is approximately 8%.

On the other hand, a second dielectric multilayer film 220 is formed on a rear facet 1B of the nitride based semiconductor laser device 1. The second dielectric multilayer film 220 has a structure in which an $AlO_XN_Y$ film (X<Y) 221c, an $AlO_XN_Y$ film (X>Y) 222c, and a reflective film 223c are laminated in this order. The refractive indexes of the $AlO_XN_Y$ film 221c and the $AlO_XN_Y$ film 222c are approximately 1.9 and approximately 1.7, respectively. The $AlO_XN_Y$ film 221c serving as an oxynitride film in which the nitrogen composition ratio is higher than the oxygen composition ratio functions as a protective film of the rear facet 1B.

The thicknesses of the $AlO_XN_Y$ film (X<Y) 221c and the $AlO_XN_Y$ film (X>Y) 222c are approximately 30 nm and approximately 30 nm, respectively. The reflective film 223c has a ten-layer structure in which five $SiO_2$ films having a thickness of approximately 70 nm and five $TiO_2$ films having a thickness of approximately 45 nm are alternately laminated. The $SiO_2$ film is used as a low refractive index film, and the $TiO_2$ film is used as a high refractive index film. The reflective index of the second dielectric multilayer film 220 is approximately 95%.

5. Correspondences Between Elements in Claims and Parts in Embodiments

In the following two paragraphs, non-limiting examples of correspondences between various elements recited in the claims below and those described above with respect to various preferred embodiments of the present invention are explained.

In the first to fourth embodiments described above, the optical waveguide WG is an example of an optical waveguide extending in a substantial [0001] direction, the light emission facet 1F is an example of one facet composed of a substantial (0001) plane, and the rear facet 1B is an example of the other facet composed of a substantial (000$\bar{1}$) plane.

Furthermore, the light emission facet 1F and the rear facet 1B are examples of a cavity facet, and the nitride based semiconductor layer including the n-type cladding layer 103, the n-type carrier blocking layer 104, the n-type optical guide layer 105, the active layer 106, the p-type optical guide layer 107, the p-type cap layer 108, the p-type cladding layer 109, and the p-type contact layer 110 is an example of a nitride based semiconductor layer.

In the first embodiment, the $Al_2O_3$ film 211 is an example of a first protective film including oxygen as a constituent element, and the AlN film 221 is an example of a second protective film including nitrogen as a constituent element. In the second embodiment, the $AlO_xN_y$ film (X>Y) 211a is an example of a first protective film including oxygen as a constituent element, and the $AlO_xN_y$ film (X<Y) 221a is an example of a second protective film including nitrogen as a constituent element. In the third embodiment, the $Al_2O_3$ film 211b is an example of a first protective film including oxygen as a constituent element, and the AlN film 221b is an example of a second protective film including nitrogen as a constituent element. In the fourth embodiment, the $AlO_xN_y$ film (X>Y) 211c is an example of a first protective film including oxygen as a constituent element, and the $AlO_xN_y$ film (X<Y) 221c is an example of a second protective film including nitrogen as a constituent element.

In the first embodiment, the $Al_2O_3$ film 211 and the $SiO_2$ film 212 in the first dielectric multilayer film 210 are respectively examples of a first oxide film and a second oxide film. In the second embodiment, the $AlO_xN_y$ film (X>Y) 211a and the $Al_2O_3$ film 212a in the first dielectric multilayer film 210 are respectively examples of an oxynitride film and an oxide film. In the third embodiment, the $Al_2O_3$ film 211b, the $AlO_xN_y$ film (X<Y) 212b, and the $Al_2O_3$ film 212b in the first dielectric multilayer film 210 are respectively examples of a first oxide film, an oxynitride film, and a second oxide film. In the fourth embodiment, the $AlO_xN_y$ film (X>Y) 211c, the $AlO_xN_y$ film (X<Y) 212c, and the $Al_2O_3$ film 213c in the first dielectric multilayer film 210 are respectively examples of a first oxynitride film, a second oxynitride film, and an oxide film.

As each of constituent elements recited in the claims, various other elements having configurations or functions described in the claims can be also used.

6. Effects of First to Fourth Embodiments (a)

In the nitride based semiconductor laser devices according to the first to fourth embodiments, one facet composed of a substantial (0001) plane and the other facet composed of a substantial (000$\bar{1}$) plane constitute a pair of cavity facets of an optical waveguide extending in a substantial [0001] direction, and laser light is respectively emitted from the one facet and the other facet.

The one facet composed of the substantial (0001) plane is easily covered with a Group 13 element such as gallium because it is a Group 13 element polar plane. The one facet is provided with a first protective film including oxygen as a constituent element. This causes binding of the Group 13 element and an oxygen element to be formed in the interface between the one facet and the first protective film. Here, binding energy between the Group 13 element and the oxygen element is significantly higher than binding energy between a nitrogen element and the oxygen element.

In a case where the first protective film includes oxygen as a constituent element, therefore, stripping of the first protective film from the one facet can be more sufficiently prevented, as compared with that in a case where it includes nitrogen as a constituent element.

On the other hand, the other facet composed of the substantial (000$\bar{1}$) plane is easily covered with nitrogen atoms because it is a nitrogen polar plane. The other facet is provided with a second protective film including nitrogen as a constituent element. Since the second protective film thus includes nitrogen that covers the other facet as a constituent element, adhesion between the other facet and the second protective film is enhanced.

This sufficiently prevents the first protective film from being stripped from the one facet while sufficiently preventing the second protective film from being stripped from the other facet. Therefore, the reliability of the nitride based semiconductor laser device is improved.

Furthermore, the intensity of the laser light emitted from the one facet is higher than the intensity of the laser light emitted from the other facet.

In this case, the one facet composed of the substantial (0001) plane is taken as a principal light emission facet. Here, the one facet is chemically stabler, as compared with the other facet composed of the substantial (000$\bar{1}$) plane. This makes it more difficult for the substantial (0001) plane to have recesses and projections formed therein, as compared with the substantial (000$\bar{1}$) plane at the time of manufacturing, thereby making it difficult for the laser light to be scattered on the one facet. Therefore, a preferable far field pattern having few ripples can be efficiently obtained.

Each of a portion of the one facet and a portion of the other facet in the optical waveguide has recesses and projections, and the depth of the recesses in the one facet is smaller than the depth of the recesses in the other facet.

In this case, the laser light is difficult to scatter on the one facet. Therefore, a preferable far field pattern having few ripples can be efficiently obtained from the one facet.

(b) Effect of Protective Film Covering Light Emission Facet 1F and Rear Facet 1B As described in the foregoing, the light emission facet 1F and the rear facet 1B of the nitride based semiconductor laser device 1 are respectively composed of a cleavage plane of (0001) and a cleavage plane of (000$\bar{1}$). Thus, the light emission facet 1F and the rear facet 1B are respectively a Ga polar plane and an N polar plane.

In the first embodiment, the light emission facet 1F is easily covered with Ga atoms because it is a Ga polar plane. The $Al_2O_3$ film 211 serving as an oxide film is formed on the light emission facet 1F. This causes binding of a Ga atom and an O atom to be formed in the interface between the light emission facet 1F and the $Al_2O_3$ film 211.

Binding energy between a Ga atom and an O atom is significantly higher than binding energy between an O atom and an N atom. In a case where the $Al_2O_3$ film 211 serving as an oxide film is formed on the light emission facet 1F, therefore, stripping of the $Al_2O_3$ film 211 from the light emission facet 1F is more sufficiently prevented, as compared with that in a case where the nitride film is formed on the light emission facet 1F.

On the other hand, the rear facet 1B composed of the (000$\bar{1}$) plane is easily covered with N atoms because it is a nitrogen polar plane. The AlN film 221 serving as a nitride film is formed on the rear facet 1B. Since the AlN film 221 thus includes N atoms covering the rear facet 1B, therefore, adhesion between the rear facet 1B and the AlN film 221 is enhanced. This sufficiently prevents the AlN film 221 from being stripped from the rear facet 1B. Therefore, the reliability of the nitride based semiconductor laser device 1 is improved.

In the second embodiment, the AlO$_X$N$_Y$ film (X>Y) 211a serving as an oxide film in which the oxygen composition ratio is higher than the nitrogen composition ratio is formed on the light emission facet 1F composed of the (0001) plane. This sufficiently prevents the AlO$_X$N$_Y$ film (X>Y) 211a from being stripped from the light emission facet 1F. Furthermore, the AlO$_X$N$_Y$ film (X<Y) 221a serving as a nitride film in which the nitrogen composition ratio is higher than the oxygen composition ratio is formed on the rear facet 1B composed of the (000$\bar{1}$) plane. This sufficiently prevents the AlO$_X$N$_Y$ film (X<Y) 221a from being stripped from the rear facet 1B.

In the third embodiment, the Al$_2$O$_3$ film 211b serving as an oxide film is formed on the light emission facet 1F composed of the (0001) plane. This sufficiently prevents the Al$_2$O$_3$ film 211b from being stripped from the light emission facet 1F. Furthermore, the AlN film 221b serving as a nitride film is formed on the rear facet 1B composed of the (000$\bar{1}$) plane. This sufficiently prevents the AlN film 221b from being stripped from the rear facet 1B.

In the fourth embodiment, the AlO$_X$N$_Y$ film (X>Y) 211c serving as an oxide film in which the oxygen composition ratio is higher than the nitrogen composition ratio is formed on the light emission facet 1F composed of the (0001) plane. This sufficiently prevents the AlO$_X$N$_Y$ film (X>Y) 211c from being stripped from the light emission facet 1F. Furthermore, the AlO$_X$N$_Y$ film (X<Y) 221c serving as a nitride film in which the nitrogen composition ratio is higher than the oxygen composition ratio is formed on the rear facet 1B composed of the (000$\bar{1}$) plane. This sufficiently prevents the AlO$_X$N$_Y$ film (X<Y) 221c from being stripped from the rear facet 1B.

(c) Effect of Taking (0001) Plane as Light Emission Facet 1F

In the present embodiment, the (0001) plane is taken as the light emission facet 1F, so that the depth of the recesses in the light emission facet 1F is smaller than the depth of the recesses in the rear facet 1B. This can inhibit the laser light from being scattered on the light emission facet 1F. As a result, a preferable far field pattern having few ripples can be obtained when the nitride based semiconductor laser device 1 is operated.

Furthermore, the second dielectric multilayer film 220 having a high reflective index is formed on the rear facet 1B. Even if a part of the laser light is scattered by the recesses and projections in the rear facet 1B, therefore, the reduction in the reflection amount is less affected by the scattering. This inhibits a power of the laser light from being reduced.

7. Fifth Embodiment (1) Configuration of Nitride Based Semiconductor Laser Device As to a nitride based semiconductor laser device according to a fifth embodiment, the difference from the nitride based semiconductor laser device 1 according to the first embodiment will be described.

Figure 8:
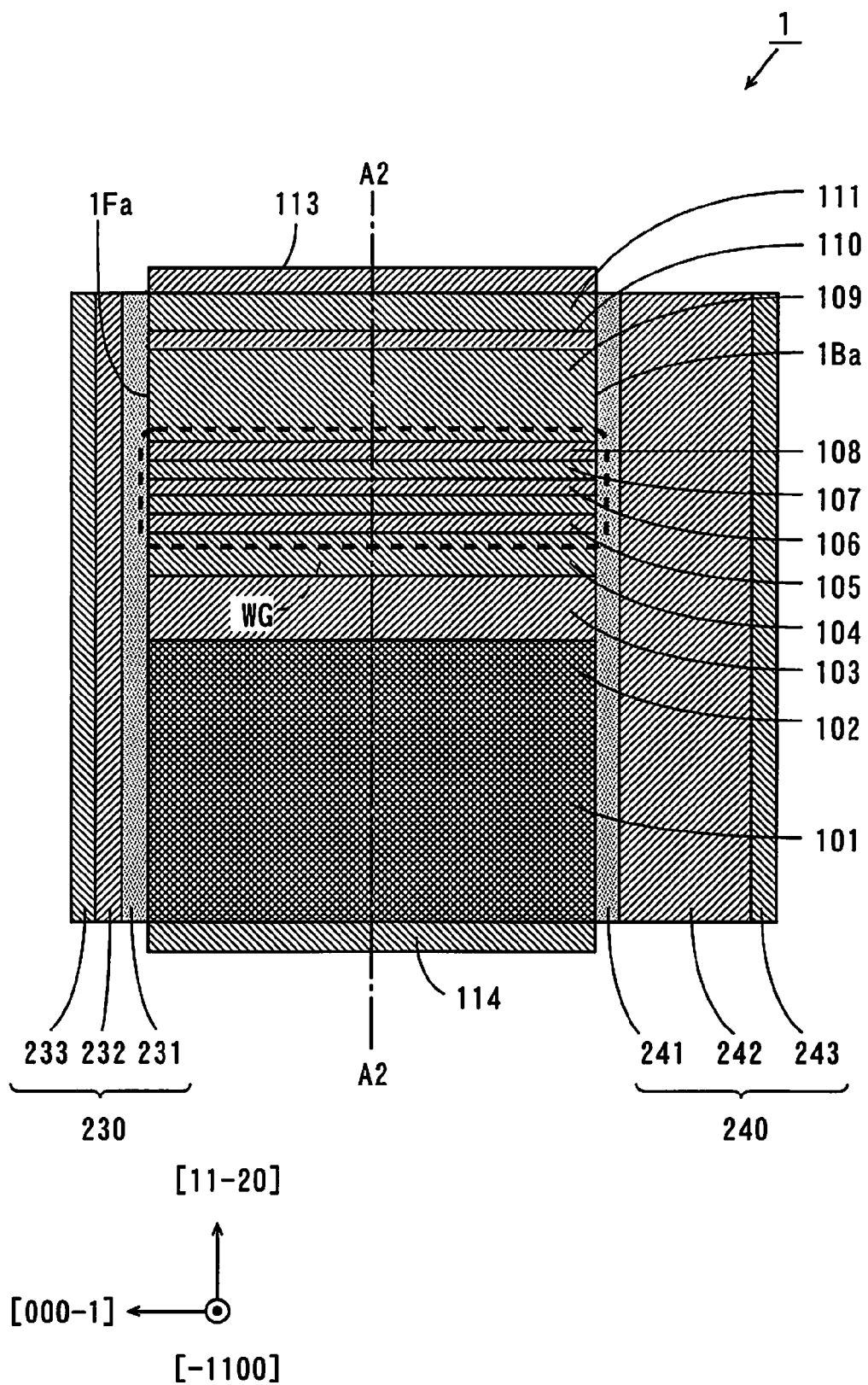
FIG. 8 is a vertical sectional view of a nitride based semiconductor laser device according to a fifth embodiment.

FIG. 8 is a vertical sectional view of the nitride based semiconductor laser device according to the fifth embodiment. In FIG. 8, a vertical section of the nitride based semiconductor laser device 1 along a [0001] direction is shown, similarly to the vertical section shown in FIG. 2 in the first embodiment. A vertical section taken along a line A2-A2 shown in FIG. 8 is the same as the vertical section of the nitride based semiconductor laser device 1 shown in FIG. 1.

As shown in FIG. 8, a light emission facet 1Fa and a rear facet 1Ba of the nitride based semiconductor laser device 1 are respectively composed of a cleavage plane of (000$\bar{1}$) and a cleavage plane of (0001).

A third dielectric multilayer film 230 is formed on the light emission facet 1Fa. The third dielectric multilayer film 230 has a structure in which an AlN film 231, an Al$_2$O$_3$ film 232, and an AlN film 233 are laminated in this order. Thus, the AlN film 231 serving as a nitride film functions as a protective film of the light emission facet 1Fa.

The thicknesses of the AlN film 231, the Al$_2$O$_3$ film 232, and the AlN film 233 are approximately 10 nm, approximately 85 nm, and approximately 10 nm, respectively. The reflective index of the third dielectric multilayer film 230 is approximately 5%.

A fourth dielectric multilayer film 240 is formed on the rear facet 1Ba. The fourth dielectric multilayer film 240 has a structure in which an Al$_2$O$_3$ film 241, a reflective film 242, and an AlN film 243 are laminated in this order. Thus, the Al$_2$O$_3$ film 241 serving as an oxide film functions as a protective film of the rear facet 1Ba.

The thickness of the Al$_2$O$_3$ film 241 is 120 nm. The reflective film 242 has a ten-layer structure in which five SiO$_2$ films having a thickness of approximately 70 nm and five TiO$_2$ films having a thickness of approximately 45 nm are alternately laminated. The SiO$_2$ film is used as a low refractive index film, and the TiO$_2$ film is used as a high refractive index film. The thickness of the AlN film 243 is 10 nm. The reflective index of the fourth dielectric multilayer film 240 is approximately 95%.

In the nitride based semiconductor laser device 1 thus formed, a voltage is applied between a pad electrode 113 and an n-side electrode 114, so that laser light is respectively emitted from the light emission facet 1Fa and the rear facet 1Ba.

In the present embodiment, the third dielectric multilayer film 230 having a reflective index of approximately 5% is provided on the light emission facet 1Fa, and the fourth dielectric multilayer film 240 having a reflective index of approximately 95% is provided on the rear facet 1Ba, as described above. This causes the intensity of the laser light emitted from the light emission facet 1Fa to be higher than the intensity of the laser light emitted from the rear facet 1Ba. That is, the light emission facet 1Fa is a principal emission facet of the laser light.

Here, in the present embodiment, undoped In$_{0.02}$Ga$_{0.98}$N is used as a barrier layer 106a in an active layer 106, and undoped In$_{0.15}$Ga$_{0.85}$N is used as a well layer 106b in the active layer 106.

Thus, in the nitride based semiconductor laser device 1 according to the present embodiment, the In composition ratio in the well layer 106b is 0.15, and is significantly lower than the Ga composition ratio. This sufficiently inhibits the recesses and projections of the active layer 106 from becoming significant in each of the light emission facet 1Fa and the rear facet 1Ba.

(2) Method for Manufacturing Nitride Based Semiconductor Laser Device 1

As to a method for manufacturing the nitride based semiconductor laser device 1 having the above-mentioned configuration, the difference from that in the above-mentioned first embodiment will be described.

When the nitride based semiconductor laser device 1 according to the present embodiment is manufactured, a substrate 101 on which an n-type layer 102, an n-type cladding layer 103, an n-type carrier blocking layer 104, an n-type optical guide layer 105, an active layer 106, a p-type optical guide layer 107, a p-type cap layer 108, a p-type cladding layer 109, and a p-type contact layer 110 are formed is cleaved such that a light emission facet 1Fa composed of a (000$\bar{1}$) plane and a rear facet 1Ba composed of a (0001) plane are formed.

Thereafter, a third dielectric multilayer film 230 is formed on the cleaned light emission facet 1Fa by ECR sputtering. Furthermore, a fourth dielectric multilayer film 240 is formed on the cleaned rear facet 1Ba by ECR sputtering.

Thereafter, the stick-shaped substrate 101 is separated into chips at the center of a groove G formed on the substrate 101. Thus, the nitride based semiconductor laser device 1 according to the fifth embodiment shown in FIG. 8 is completed.

8. Sixth Embodiment

As to a nitride based semiconductor laser device according to a sixth embodiment, the difference from the nitride based semiconductor laser device 1 according to the fifth embodiment will be described.

Figure 9:
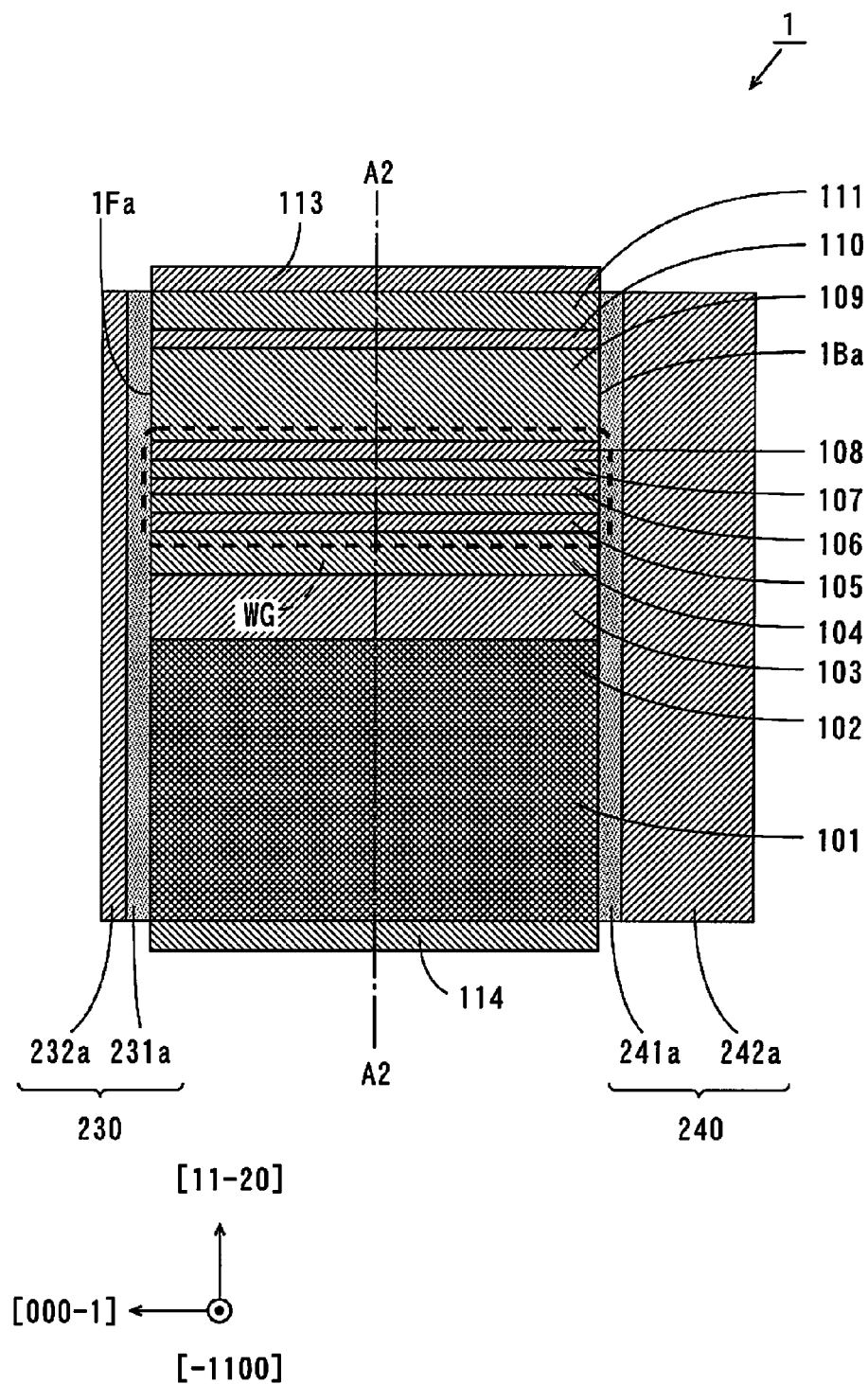
FIG. 9 is a vertical sectional view of a nitride based semiconductor laser device according to a sixth embodiment.

FIG. 9 is a vertical sectional view of the nitride based semiconductor laser device according to the sixth embodiment. In FIG. 9, a vertical section of the nitride based semiconductor laser device 1 along a [0001] direction is shown, similarly to the vertical section shown in FIG. 2 in the first embodiment. A vertical section taken along a line A2-A2 shown in FIG. 9 is the same as the vertical section of the nitride based semiconductor laser device 1 shown in FIG. 1.

A third dielectric multilayer film 230 is formed on a light emission facet 1Fa. The third dielectric multilayer film 230 has a structure in which an $AlO_XN_Y$ film (X<Y) 231a and an $Al_2O_3$ film 232a are laminated in this order. The refractive index of the $AlO_XN_Y$ film 231a is approximately 1.9. The $AlO_XN_Y$ film 231a serving as an oxynitride film in which the nitrogen composition ratio is higher than the oxygen composition ratio functions as a protective film of the light emission facet 1Fa.

The thicknesses of the $AlO_XN_Y$ film 231a and the $Al_2O_3$ film 232a are approximately 30 nm and approximately 65 nm, respectively. The reflective index of the third dielectric multilayer film 230 is approximately 8%.

A fourth dielectric multilayer film 240 is formed on a rear facet 1Ba. The fourth dielectric multilayer film 240 has a structure in which an $AlO_XN_Y$ (X>Y) 241a and a reflective film 242a are laminated in this order. The refractive index of the $AlO_XN_Y$ film 241a is approximately 1.7. The $AlO_XN_Y$ film 241a serving as an oxynitride film in which the oxygen composition ratio is higher than the nitrogen composition ratio functions as a protective film of the rear facet 1Ba.

The thickness of the $AlO_XN_Y$ film 241a is approximately 30 nm. The reflective film 242a has a ten-layer structure in which five $SiO_2$ films having a thickness of approximately 70 nm and five $TiO_2$ films having a thickness of approximately 45 nm are alternately laminated. The $SiO_2$ film is used as a low refractive index film, and the $TiO_2$ film is used as a high refractive index film. The reflective index of the fourth dielectric multilayer film 240 is approximately 95%.

9. Seventh Embodiment

As to a nitride based semiconductor laser device according to a seventh embodiment, the difference from the nitride based semiconductor laser device according to the fifth embodiment will be described.

Figure 10:
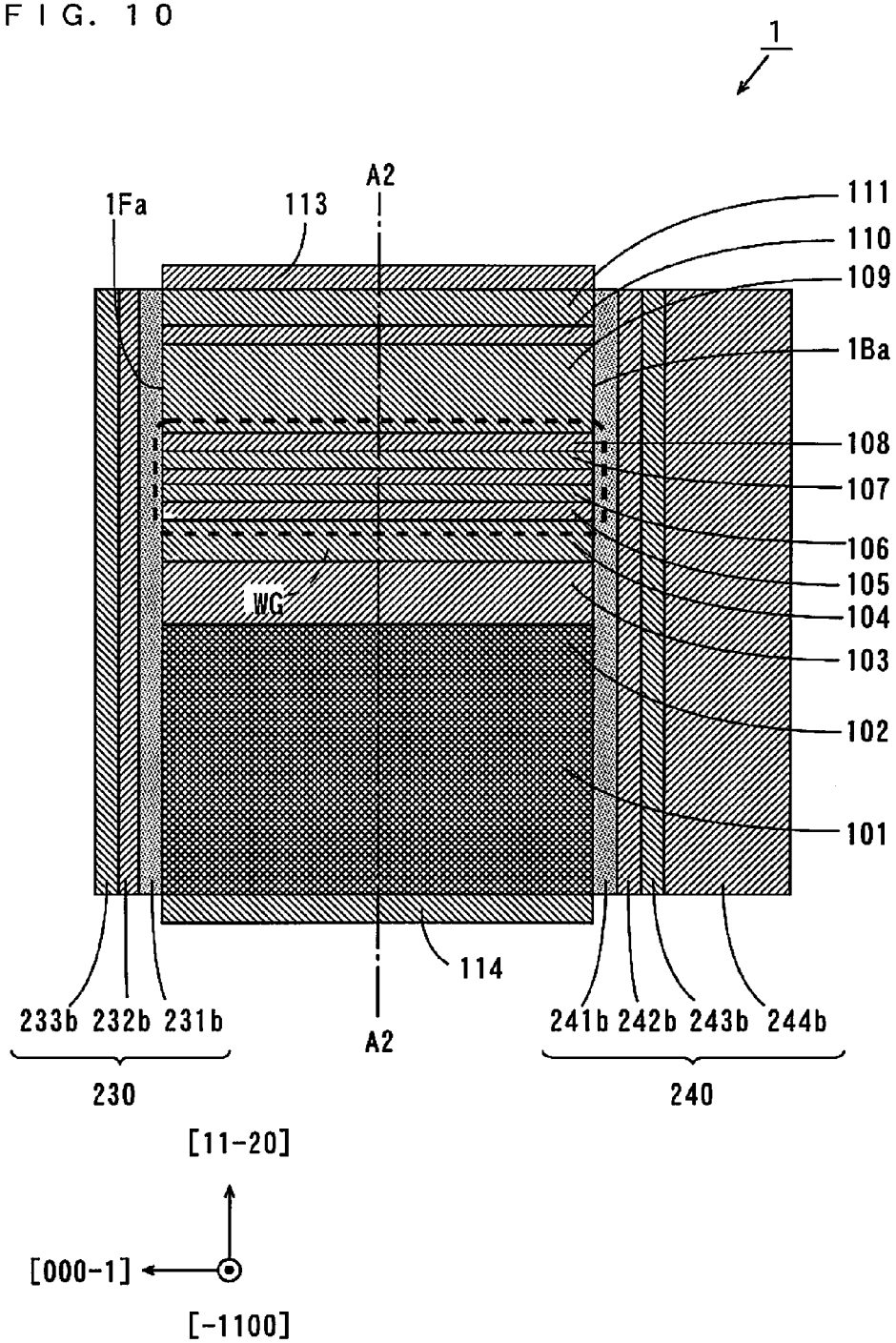
FIG. 10 is a vertical sectional view of a nitride based semiconductor laser device according to a seventh embodiment.

FIG. 10 is a vertical sectional view of the nitride based semiconductor laser device according to the seventh embodiment. In FIG. 10, a vertical section of the nitride based semiconductor laser device 1 along a [0001] direction is shown, similarly to the vertical section shown in FIG. 2 in the first embodiment. A vertical section taken along a line A2-A2 shown in FIG. 10 is the same as the vertical section of the nitride based semiconductor laser device 1 shown in FIG. 1.

A third dielectric multilayer film 230 is formed on a light emission facet 1Fa. The third dielectric multilayer film 230 has a structure in which an AlN film 231b, an $AlO_XN_Y$ film (X<Y) 232b, and an $Al_2O_3$ film 233b are laminated in this order. The refractive index of the $AlO_XN_Y$ film 231b is approximately 1.9. The AlN film 231b serving as a nitride film functions as a protective film of the light emission facet 1Fa.

The thicknesses of the AlN film 231b, the $AlO_XN_Y$ film 232b, and the $Al_2O_3$ film 233b are approximately 10 nm, approximately 30 nm, and approximately 62 nm, respectively. The reflective index of the third dielectric multilayer film 230 is approximately 8%.

A fourth dielectric multilayer film 240 is formed on a rear facet 1Ba. The fourth dielectric multilayer film 240 has a structure in which an $Al_2O_3$ film 241b, an $AlO_XN_Y$ film (X<Y) 242b, an $Al_2O_3$ film 243b, and a reflective film 244b are laminated in this order. The refractive index of the $AlO_XN_Y$ film 242b is approximately 1.9. The $Al_2O_3$ film 241b serving as an oxide film functions as a protective film of the rear facet 1Ba.

The thicknesses of the $Al_2O_3$ film 241b, the $AlO_XN_Y$ film 242b, and the $Al_2O_3$ film 243b are approximately 60 nm, approximately 30 nm, and approximately 60 nm, respectively. The reflective film 244b has a ten-layer structure in which five $SiO_2$ films having a thickness of approximately 70 nm and five $TiO_2$ films having a thickness of approximately 45 nm are alternately laminated. The $SiO_2$ film is used as a low refractive index film, and the $TiO_2$ film is used as a high refractive index film. The reflective index of the fourth dielectric multilayer film 240 is approximately 95%.

10. Eighth Embodiment

As to a nitride based semiconductor laser device according to an eighth embodiment, the difference from the nitride based semiconductor laser device 1 according to the fifth embodiment will be described.

Figure 11:
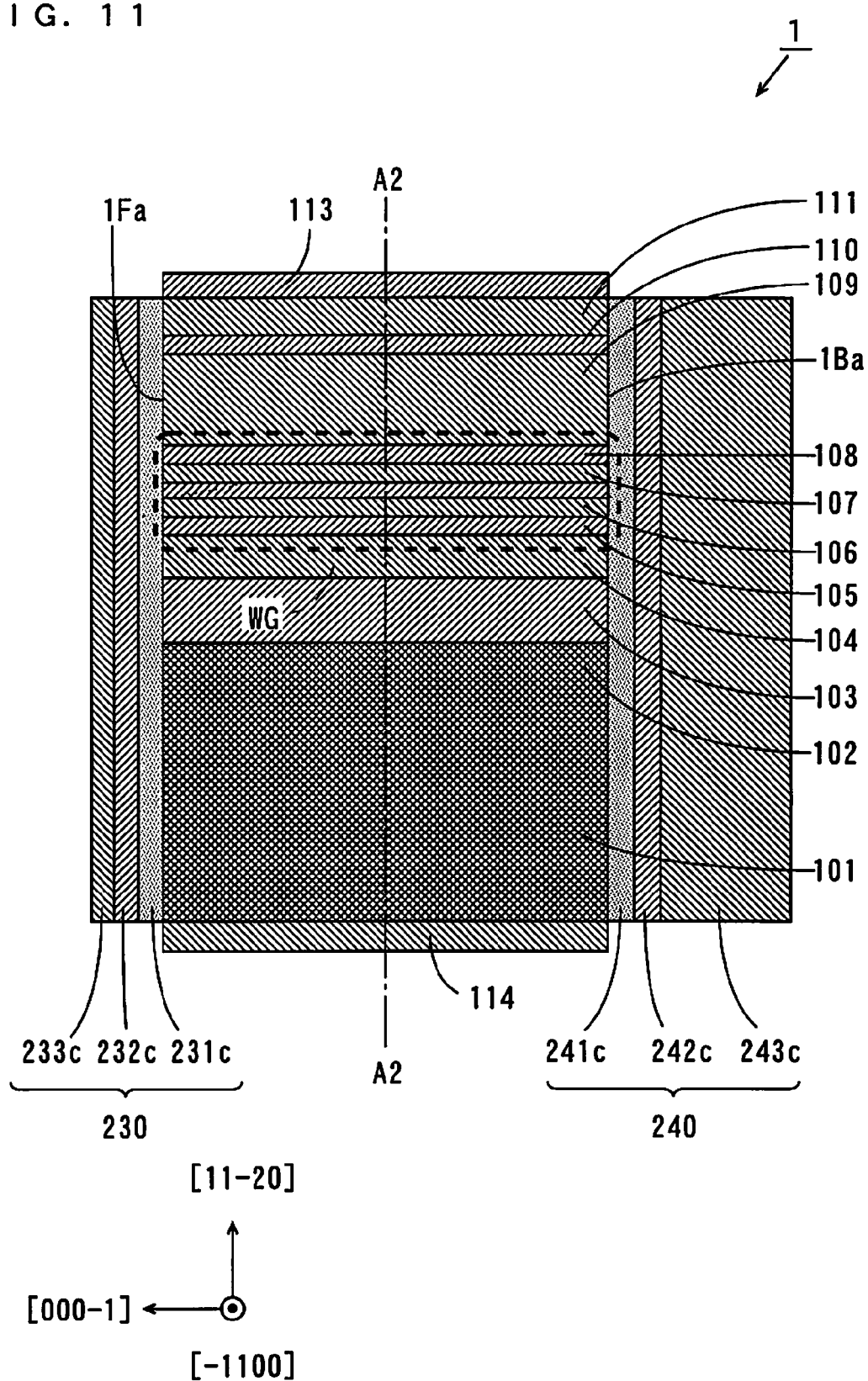
FIG. 11 is a vertical sectional view of a nitride based semiconductor laser device according to an eighth embodiment.

FIG. 11 is a vertical sectional view of the nitride based semiconductor laser device according to the eighth embodiment. In FIG. 11, a vertical section of a nitride based semiconductor laser device 1 along a [0001] direction is shown, similarly to the vertical section shown in FIG. 2 in the first embodiment. A vertical section taken along a line A2-A2 shown in FIG. 11 is the same as the vertical section of the nitride based semiconductor laser device 1 shown in FIG. 1.

A third dielectric multilayer film 230 is formed on a light emission facet 1Fa. The third dielectric multilayer film 230 has a structure in which an $AlO_XN_Y$ film (X<Y) 231c, an $AlO_XN_Y$ film (X>Y) 232c, and an $Al_2O_3$ film 233c are laminated in this order. The refractive indexes of the $AlO_XN_Y$ film 231c and the $AlO_XN_Y$ film 232c are approximately 1.9 and approximately 1.7, respectively. The $AlO_XN_Y$ film (X<Y) 231c serving as an oxynitride film in which the nitrogen composition ratio is higher than the oxygen composition ratio functions as a protective film of the light emission facet 1Fa.

The thicknesses of the AlO$_X$N$_Y$ film 231c, the AlO$_X$N$_Y$ film 232c, and the Al$_2$O$_3$ film 233c are approximately 30 nm, approximately 30 nm, and approximately 35 nm, respectively. The reflective index of the third dielectric multilayer film 230 is approximately 8%.

A fourth dielectric multilayer film 240 is formed on a rear facet 1Ba. The fourth dielectric multilayer film 240 has a structure in which an AlO$_X$N$_Y$ film (X>Y) 241c, an AlO$_X$N$_Y$ film (X<Y) 242c, and a reflective film 243c are laminated in this order. The refractive indexes of the AlO$_X$N$_Y$ film 241c and the AlO$_X$N$_Y$ film 242c are approximately 1.7 and approximately 1.9, respectively. The AlO$_X$N$_Y$ film 241c serving as an oxynitride film in which the oxygen composition ratio is higher than the nitrogen composition ratio functions as a protective film of the rear facet 1Ba.

The thicknesses of the AlO$_X$N$_Y$ film 241c and the AlO$_X$N$_Y$ film 242c are approximately 30 nm and approximately 30 nm, respectively. The reflective film 243c has a ten-layer structure in which five SiO$_2$ films having a thickness of approximately 70 nm and five TiO$_2$ films having a thickness of approximately 45 nm are alternately laminated. The SiO$_2$ film is used as a low refractive index film, and the TiO$_2$ film is used as a high refractive index film. The reflective index of the fourth dielectric multilayer film 240 is approximately 95%.

11. Correspondences Between Elements in Claims and Parts in Embodiments

In the following two paragraphs, non-limiting examples of correspondences between various elements recited in the claims below and those described above with respect to various preferred embodiments of the present invention are explained.

In the fifth to eighth embodiments described above, the optical waveguide WG is an example of an optical waveguide extending in a substantial [0001] direction, the rear facet 1Ba is an example of one facet composed of a substantial (0001) plane, and the light emission facet 1Fa is an example of the other facet composed of a substantial (0001) plane.

Furthermore, the light emission facet 1Fa and the rear facet 1Ba are examples of a cavity facet, and the nitride based semiconductor layer including the n-type cladding layer 103, the n-type carrier blocking layer 104, the n-type optical guide layer 105, the active layer 106, the p-type optical guide layer 107, the p-type cap layer 108, the p-type cladding layer 109, and the p-type contact layer 110 is an example of a nitride based semiconductor layer.

In the fifth embodiment, the AlN film 231 is an example of a second protective film including nitrogen as a constituent element, and the Al$_2$O$_3$ film 241 is an example of a first protective film including oxygen as a constituent element. In the sixth embodiment, the AlO$_X$N$_Y$ film (X<Y) 231a is an example of a second protective film including nitrogen as a constituent element, and the AlO$_X$N$_Y$ film (X>Y) 241a is an example of a first protective film including oxygen as a constituent element. In the seventh embodiment, the AlN film 231b is an example of a second protective film including nitrogen as a constituent element, and the Al$_2$O$_3$ film 241b is an example of a first protective film including oxygen as a constituent element. In the eighth embodiment, the AlO$_X$N$_Y$ film (X<Y) 231c is an example of a second protective film including nitrogen as a constituent element, and the AlO$_X$N$_Y$ film (X>Y) 241c is an example of a first protective film including oxygen as a constituent element.

In the fifth embodiment, the AlN film 231, the Al$_2$O$_3$ film 232, and the AlN film 233 in the third dielectric multilayer film 230 are respectively examples of a first nitride film (nitride film), an oxide film, and a second nitride film. In the sixth embodiment, the AlO$_X$N$_Y$ film (X<Y) 231a and the Al$_2$O$_3$ film 232a in the third dielectric multilayer film 230 are respectively examples of an oxynitride film and an oxide film. In the seventh embodiment, the AlN film 231b, the AlO$_X$N$_Y$ film (X<Y) 232b, and the Al$_2$O$_3$ film 233b in the third dielectric multilayer film 230 are respectively examples of a nitride film, an oxynitride film, and an oxide film. In the eighth embodiment, the AlO$_X$N$_Y$ film (X<Y) 231c, the AlO$_X$N$_Y$ film (X>Y) 232c, and the Al$_2$O$_3$ film 233c are respectively examples of a first oxynitride film, a second oxynitride film, and an oxide film.

As each of constituent elements recited in the claims, various other elements having configurations or functions described in the claims can be also used.

12. Effects of Fifth to Eighth Embodiments (a)

In the nitride based semiconductor laser devices according to the fifth to eighth embodiments, one facet composed of a substantial (0001) plane and the other facet composed of a substantial (000$\overline{1}$) plane constitute a pair of cavity facets of an optical waveguide extending in a substantial [0001] direction, and laser light is respectively emitted from the one facet and the other facet.

The one facet composed of the substantial (0001) plane is easily covered with a Group 13 element such as gallium because it is a Group 13 element polar plane. The one facet is provided with a first protective film including oxygen as a constituent element. This causes binding of the Group 13 element and an oxygen element to be formed in the interface between the one facet and the first protective film. Here, binding energy between the Group 13 element and the oxygen element is significantly higher than binding energy between a nitrogen element and the oxygen element.

In a case where the first protective film includes oxygen as a constituent element, therefore, stripping of the first protective film from the one facet can be more sufficiently prevented, as compared with that in a case where it includes nitrogen as a constituent element.

On the other hand, the other facet composed of the substantial (000$\overline{1}$) plane is easily covered with nitrogen atoms because it is a nitrogen polar plane. The other facet is provided with a second protective film including nitrogen as a constituent element. Since the second protective film thus includes nitrogen that covers the other facet as a constituent element, adhesion between the other facet and the second protective film is enhanced.

This sufficiently prevents the first protective film from being stripped from the one facet while sufficiently preventing the second protective film from being stripped from the other facet. Therefore, the reliability of the nitride based semiconductor laser device is improved.

Furthermore, the intensity of the laser light emitted from the other facet is higher than the intensity of the laser light emitted from the one facet.

In this case, the other facet composed of the substantial (000$\overline{1}$) plane is taken s a principal light emission facet. Here, the one facet composed of the substantial (0001) plane is easy to oxidize because it is easily covered with a Group 13 element. On the other hand, the other facet composed of the substantial (000$\overline{1}$) plane is difficult to oxidize because it is easily covered with N atoms. This inhibits the principal light emission facet from being degraded by oxidation, making a stable high power operation feasible.

(b) Effect of Protective Film Covering Light Emission Facet 1Fa and Rear Facet 1Ba In the fifth embodiment, the light emission facet 1Fa composed of the (000$\bar{1}$) plane is easily covered with N atoms because it is an N polar plane. The AlN film 231 serving as a nitride film is formed on the light emission facet 1Fa. Since the AlN film 231 thus includes N atoms covering the light emission facet 1Fa, adhesion between the light emission facet 1Fa and the AlN film 231 is enhanced. This sufficiently prevents the AlN film 231 from being stripped from the light emission facet 1Fa.

On the other hand, the rear facet 1Ba composed of the (0001) plane is easily covered with Ga atoms because it is a Ga polar plane. The $Al_2O_3$ film 241 serving as an oxide film is formed on the rear facet 1Ba. This causes binding of a Ga atom and an O atom to be formed in the interface between the rear facet 1Ba and the $Al_2O_3$ film 241.

Binding energy between a Ga atom and an O atom is significantly higher than binding energy between an O atom and an N atom. In a case where the $Al_2O_3$ film 241 serving as an oxide film is formed on the rear facet 1Ba, therefore, stripping of the $Al_2O_3$ film 241 from the rear facet 1Ba is more sufficiently prevented, as compared with that in a case where the nitride film is formed on the rear facet 1Ba. Therefore, the reliability of the nitride based semiconductor laser device 1 is improved.

In the sixth embodiment, the $AlO_XN_Y$ film (X<Y) 231a serving as a nitride film in which the nitrogen composition ratio is higher than the oxygen composition ratio is formed on the light emission facet 1Fa composed of the (000$\bar{1}$) plane. This sufficiently prevents the $AlO_XN_Y$ film (X<Y) 231a from being stripped from the light emission facet 1Fa. Furthermore, the $AlO_XN_Y$ film (X>Y) 241a serving as an oxide film in which the oxygen composition ratio is higher than the nitrogen composition ratio is formed on the rear facet 1Ba composed of the (0001) plane. This sufficiently prevents the $AlO_XN_Y$ film (X>Y) 241a from being stripped from the rear facet 1Ba.

In the seventh embodiment, the AlN film 231b serving as a nitride film is formed on the light emission facet 1Fa composed of the (000$\bar{1}$) plane. This sufficiently prevents the AlN film 231b from being stripped from the light emission facet 1Fa. Furthermore, the $Al_2O_3$ film 241b serving as an oxide film is formed on the rear facet 1Ba composed of the (0001) plane. This sufficiently prevents the $Al_2O_3$ film 241b from being stripped from the rear facet 1Ba.

In the eighth embodiment, the $AlO_XN_Y$ film (X<Y) 231c serving as a nitride film in which the nitrogen composition ratio is higher than the oxygen composition ratio is formed on the light emission facet 1Fa composed of the (000$\bar{1}$) plane. This sufficiently prevents the $AlO_XN_Y$ film (X<Y) 231c from being stripped from the light emission facet 1Fa. Furthermore, the $AlO_XN_Y$ film (X>Y) 241c serving as an oxide film in which the oxygen composition ratio is higher than the nitrogen composition ratio is formed on the rear facet 1Ba composed of the (0001) plane. This sufficiently prevents the $AlO_XN_Y$ film (X>Y) 241c from being stripped from the rear facet 1Ba.

(c) Effect of Taking (0001) Plane as Light Emission Facet 1F

The (0001) plane serving as a Ga polar plane is easy to oxidize because its top surface is easily covered with Ga atoms. On the other hand, the (000$\bar{1}$) plane serving as a N polar plane is difficult to oxidize because its top surface is easily covered with N atoms.

In the present embodiment, the (000$\bar{1}$) plane is taken as the light emission facet 1Fa. This inhibits the light emission facet 1Fa from being degraded by oxidation. This allows the laser characteristics of the nitride based semiconductor laser device 1 to be kept stable, making a stable high power operation feasible.

Furthermore, in the present embodiment, undoped $In_{0.15}Ga_{0.85}N$ is used as the well layer 106b. When the In composition ratio is significantly lower than the Ga composition ratio in the well layer 106b, the recesses and projections of the active layer 106 in each of the light emission facet 1Fa and the rear facet 1Ba are sufficiently inhibited from becoming significant.

In the (000$\bar{1}$) plane where greater recesses and projections are more easily formed than those in the (0001) plane, the recesses and projections are prevented from becoming significant. As a result, when the scattering of the laser light emitted from the light emission facet 1Fa is reduced, so that a preferable far field pattern having few ripples is obtained.

13. Modified Example of Fifth to Eighth Embodiments

A modified example of the fifth to eighth embodiments will be then described. The following is the difference between the nitride based semiconductor laser device 1 according to the above-mentioned embodiments and the nitride based semiconductor laser device 1 in this example.

$Al_{0.03}Ga_{0.97}N$ is used as the n-type cladding layer 103 and the p-type cladding layer 109 in this example. The amount of doping of Si into the n-type cladding layer 103 and the amount of doping of Mg into the p-type cladding layer 109 are the same as those in the second embodiment. Furthermore, the respective carrier concentrations and thicknesses of the n-type cladding layer 103 and the p-type cladding layer 109 are the same as those in the above-mentioned embodiments.

An n-type GaN is used as the n-type optical guide layer 105, n-type $Al_{0.10}Ga_{0.90}N$ is used as the n-type carrier blocking layer 104, and n-type $In_{0.05}Ga_{0.95}N$ is used as the n-type optical guide layer 105. The respective amounts of doping of Mg into the n-type carrier blocking layer 104 and the n-type optical guide layer 105 are the same as those in the second embodiment. Furthermore, the respective carrier concentrations and thicknesses of the n-type carrier blocking layer 104 and the n-type optical guide layer 105 are the same as those in the above-mentioned embodiments.

An active layer 106 having an MQW structure in which three barrier layers 106a composed of undoped $In_{0.25}Ga_{0.75}N$ and two well layers 106b composed of undoped $In_{0.55}Ga_{0.45}N$ are alternately laminated is used in this example. The respective thicknesses of each of the barrier layers 106a and each of the well layers 106b are the same as those in the above-mentioned embodiments.

P-type $In_{0.05}Ga_{0.95}N$ is used as a p-type optical guide layer 107, and p-type $Al_{0.10}Ga_{0.90}N$ is used as a p-type cap layer 108 in this example. The respective amounts of doping of Mg into the p-type optical guide layer 107 and the p-type cap layer 108 are the same as those in the above-mentioned embodiments. Furthermore, the respective carrier concentrations and thicknesses of the p-type optical guide layer 107 and the p-type cap layer 108 are the same as those in the above-mentioned embodiments.

In this example, the In composition ratio included in the active layer 106 is higher than the Ga composition ratio included therein. In this case, a portion of the active layer 106 in the light emission facet 1Fa is easier to oxidize. Therefore, taking the (000$\bar{1}$) plane that is difficult to oxidize as the light emission facet 1Fa can inhibit the light emission facet 1Fa from being degraded by oxidation. This allows the laser characteristics of the nitride based semiconductor laser device 1 to be kept stable, making a stable high power operation feasible.

14. Other Embodiments (1) Although in the above-mentioned embodiments, the oxide films in the first to fourth dielectric multilayer films 210, 220, 230, 240 are formed of $Al_2O_3$, the nitride film is formed of AlN, and the oxynitride film is formed of $AlO_XN_Y$, the present invention is not limited to the same. The oxide films in the first to fourth dielectric multilayer films 210, 220, 230, and 240 may be formed of one or more of $Al_2O_3$, $SiO_2$, $ZrO_2$, $Ta_2O_5$, $HfO_2$, and $AlSiO_x$, for example. Here, X is a real number larger than zero. The nitride films in the first to fourth dielectric multilayer films 210, 220, 230, and 240 may be formed of one or both of AlN and $Si_3N_4$, for example. Furthermore, the oxynitride film may be formed of one or more of $AlO_XN_Y$, $SiO_XN_Y$, and $TaO_XN_Y$, for example. Here, X and Y are real numbers larger than zero.

In the above-mentioned embodiments, the ratio of the nitrogen composition ratio to the oxygen composition ratio in each of the $AlO_XN_Y$ film (X<Y) 221a, 212b, 222b, 212c, 221c, 231a, 232b, 242b, 231c, and 242c is 54(%):46(%), for example.

Although in the above-mentioned embodiments, $SiO_2$ is used as a material for a low refractive index film, and $TiO_2$ is used as a material for a high refractive index film, the present invention is not limited to the same. Another material such as $MgF_2$ or $Al_2O_3$ may be used as a material for a low refractive index film. Another material such as $ZrO_2$, $Ta_2O_5$, $CeO_2$, $Y_2O_3$, $Nb_2O_5$, or $HfO_2$ may be used as a material for a high refractive index film.

(2) When at least one of the light emission facet 1F and the rear facet 1B or at least one of the light emission facet 1Fa and the rear facet 1Ba is formed by cleavage, a main surface of the active layer 106 may have any plane direction in a range of ± approximately 0.3 degrees from a (H, K, —H—K, O) plane. Note that H and K are any integers, and at least one of H and K is an integer other than zero. Furthermore, the light emission facets 1F and 1Fa and the rear facets 1B and 1Ba that are formed by cleavage may respectively have any plane directions in a range of ± approximately 0.3 degrees from the (0001) plane and the (000$\bar{1}$) plane.

When the light emission facets 1F and 1Fa and the rear facets 1B and 1Ba are formed by methods other than cleavage, for example, etching, grinding, or selective growth, the light emission facets 1F and 1Fa and the rear facets 1B and 1Ba may respectively have any plane directions in a range of ± approximately 25 degrees from the (0001) plane and the (000$\bar{1}$) plane. However, it is desired that the light emission facets 1F and 1Fa and the rear facets 1B and 1Ba are substantially perpendicular (90 degrees±approximately 5 degrees) to the main surface of the active layer 106.

(3) A nitride of a Group 13 element including at least one of Ga, Al, In, Tl, and B can be used for the substrate 101, the n-type layer 102, the n-type cladding layer 103, the n-type carrier blocking layer 104, the n-type optical guide layer 105, the active layer 106, the p-type optical guide layer 107, the p-type cap layer 108, the p-type cladding layer 109, and the p-type contact layer 110. Specifically, a nitride based semiconductor composed of AlN, InN, BN, TlN, GaN, AlGaN, InGaN, InAlGa or their mixed crystals can be used as a material for each of the layers.

(4) In the first, third, fifth and seventh embodiments, when an AlN film is formed on the other facet (000$\bar{1}$), as the protection film of the first layer being in contact with the semiconductor, the AlN film may be formed to have high orientation in the (000$\bar{1}$) direction. In this case, thermal conductivity in the (000$\bar{1}$) direction becomes increased, and a temperature rise at the semiconductor interface can be suppressed, resulting in improved reliability.

When a second AlN film is further formed as a layer other than the protection film of the first layer as the first and fifth embodiments, the orientation of the AlN film of the first layer need not necessarily coincide with that of the second AlN film, and the second AlN film need not necessarily be formed to have high orientation as with the AlN film of the first layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A nitride based semiconductor laser device comprising:
   a nitride based semiconductor layer having an optical waveguide extending in a substantial [0001] direction and having one facet composed of a substantial (0001) plane and the other facet composed of a substantial (000-1) plane as a pair of cavity facets;
   a first protective film provided on said one facet and including oxygen as a constituent element; and
   a second protective film provided on said other facet and including nitrogen as a constituent element,
   wherein the intensity of laser light emitted from said one facet is higher than the intensity of laser light emitted from said other facet,
   said first protective film further includes nitrogen as a constituent element, the first protective film's oxygen composition ratio being higher than the nitrogen composition ratio, and
   said second protective film further includes oxygen as a constituent element, the second protective film's nitrogen composition ratio being higher than the oxygen composition ratio.

2. The nitride based semiconductor laser device according to claim 1, wherein
   each of a portion of said one facet and a portion of said other facet in said optical waveguide has unevenness, and
   the depth of a first recess in said one facet is smaller than the depth of a second recess in said other facet.

3. The nitride based semiconductor laser device according to claim 1, further comprising
   a dielectric multilayer film formed on said one facet and including said first protective film,
   wherein said dielectric multilayer film includes an oxynitride film and an oxide film that are laminated in this order from said one facet, the oxygen composition ratio is higher than the nitrogen composition ratio in said oxynitride film, and said first protective film is said oxynitride film.

4. The nitride based semiconductor laser device according to claim 1, further comprising
   a dielectric multilayer film formed on said one facet and including said first protective film,
   wherein said dielectric multilayer film includes a first oxynitride film, a second oxynitride film, and an oxide film that are laminated in this order from said one facet, the oxygen composition ratio is higher than the nitrogen composition ratio in said first oxynitride film, the nitrogen composition ratio is higher than the oxygen composition ratio in said second oxynitride film, and said first protective film is said first oxynitride film.

5. The nitride based semiconductor laser device according to claim 1, further comprising
a dielectric multilayer film formed on said other facet and including said second protective film,
wherein said dielectric multilayer film includes an oxynitride film and an oxide film that are laminated in this order from said other facet, the nitrogen composition ratio is higher than the oxygen composition ratio in said oxynitride film, and said second protective film is said oxynitride film.

6. The nitride based semiconductor laser device according to claim 1, further comprising
a dielectric multilayer film formed on said other facet and including said second protective film,
wherein said dielectric multilayer film includes a first oxynitride film, a second oxynitride film, and an oxide film that are laminated in this order from said other facet, the nitrogen composition ratio is higher than the oxygen composition ratio in said first oxynitride film, the oxygen composition ratio is higher than the nitrogen composition ratio in said second oxynitride film, and said second protective film is said first oxynitride film.

7. The nitride based semiconductor laser device according to claim 1, wherein said first protective film includes at least one of $AlO_XN_Y$, $SiO_XN_Y$ and $TaO_XN_Y$, where $X>Y$.

8. The nitride based semiconductor laser device according to claim 1, wherein said second protective film includes at least one of $AlO_XN_Y$, $SiO_XN_Y$ and $TaO_XN_Y$, where $X<Y$.

* * * * *